US011239102B2

(12) United States Patent
Goto

(10) Patent No.: US 11,239,102 B2
(45) Date of Patent: Feb. 1, 2022

(54) STOCKER SYSTEM

(71) Applicant: Murata Machinery, Ltd., Kyoto (JP)

(72) Inventor: Fumiki Goto, Inuyama (JP)

(73) Assignee: Murata Machinery, Ltd., Kyoto (JP)

(\*) Notice: Subject to any disclaimer, the term of this patent is extended or adjusted under 35 U.S.C. 154(b) by 0 days.

(21) Appl. No.: 16/981,727

(22) PCT Filed: Feb. 4, 2019

(86) PCT No.: PCT/JP2019/003837
§ 371 (c)(1),
(2) Date: Sep. 17, 2020

(87) PCT Pub. No.: WO2019/181241
PCT Pub. Date: Sep. 26, 2019

(65) Prior Publication Data
US 2021/0043487 A1 Feb. 11, 2021

(30) Foreign Application Priority Data

Mar. 22, 2018 (JP) .............................. JP2018-054470

(51) Int. Cl.
*H01L 21/677* (2006.01)
*B65G 1/04* (2006.01)
(Continued)

(52) U.S. Cl.
CPC ...... *H01L 21/67736* (2013.01); *B65G 1/0464* (2013.01); *B65G 1/06* (2013.01);
(Continued)

(58) Field of Classification Search
CPC ......... H01L 21/67736; H01L 21/67706; H01L 21/67733; H01L 21/67724;
(Continued)

(56) References Cited

U.S. PATENT DOCUMENTS 6,183,184 B1\* 2/2001 Shiwaku .............. B65G 1/0464
212/327
2007/0081879 A1\* 4/2007 Bonora ............. H01L 21/67769
414/217
(Continued)

FOREIGN PATENT DOCUMENTS

EP 2 450 297 A1 5/2012
JP 2005-150129 A 6/2005
(Continued)

OTHER PUBLICATIONS

First Office Action dated May 31, 2021, of counterpart Chinese Application No. 201980020969.6, along with an English translation.
(Continued)

*Primary Examiner* — Glenn F Myers
(74) *Attorney, Agent, or Firm* — DLA Piper LLP (US)

(57) ABSTRACT

A stocker is disposed above a processing device and includes: a plurality of shelves provided in multiple stages in an up-down direction, to place articles thereon; and a crane to place an article on the shelves or take out an article placed on the shelves. The shelves include: a carry-in/out port used for an overhead transport vehicle to place an article thereon; and storage shelves used for the crane to place an article thereon. The carry-in/out port has a vertical dimension that allows a grip of the overhead transport vehicle to place the article from above. More storage shelves are provided than the carry-in/out port and are provided to have a smaller vertical dimension than that of the carry-in/out port. The crane places an article on the carry-in/out port onto the storage shelves or place an article on the storage shelves onto the carry-in/out port by a transfer device.

7 Claims, 15 Drawing Sheets

(51) Int. Cl.
*B65G 1/06* (2006.01)
*B66F 9/14* (2006.01)
*B66C 19/00* (2006.01)

(52) U.S. Cl.
CPC .......... *B66F 9/14* (2013.01); *H01L 21/67706* (2013.01); *H01L 21/67724* (2013.01); *H01L 21/67733* (2013.01); *B66C 19/005* (2013.01)

(58) Field of Classification Search
CPC ... H01L 21/67775; B65G 1/0464; B65G 1/06; B66F 9/14; B66C 19/005; B66C 19/007; B66C 19/002
See application file for complete search history.

(56) References Cited

U.S. PATENT DOCUMENTS

| | | | | |
|---|---|---|---|---|
| 2008/0240892 A1* | 10/2008 | Courtois | ........... | H01L 21/67769 414/225.01 |
| 2012/0118845 A1* | 5/2012 | Wada | ................ | H01L 21/6773 212/71 |
| 2013/0343844 A1* | 12/2013 | Fosnight | ............... | H01L 21/677 414/281 |
| 2015/0045937 A1 | 2/2015 | Yamamoto | | |
| 2015/0110585 A1* | 4/2015 | Ota | ................... | H01L 21/67766 414/222.13 |
| 2019/0006217 A1 | 1/2019 | Motoori | | |

FOREIGN PATENT DOCUMENTS

| | | | | |
|---|---|---|---|---|
| JP | 2009-154983 A | 7/2009 | | |
| JP | 5228504 B2 | 7/2013 | | |
| JP | 2013154983 A * | 8/2013 | ....... | H01L 21/67769 |
| JP | 5880693 B2 | 2/2016 | | |
| WO | 2013/150841 A1 | 10/2013 | | |
| WO | 2017/029871 A1 | 2/2017 | | |
| WO | 2018/003287 A1 | 1/2018 | | |

OTHER PUBLICATIONS

The Extended European Search Report dated Nov. 16, 2021, of counterpart European Application No. 19771493.4.

* cited by examiner (A)

(B)

STOCKER SYSTEM

TECHNICAL FIELD

This disclosure relates to a stocker system.

BACKGROUND

In semiconductor manufacturing factories, a stocker to store articles such as FOUPs to store semiconductor wafers and reticle pods to store reticles is provided. The stocker includes a plurality of shelves installed on the floor of a building and a crane that moves along the shelves (see, for example, Japanese Patent No. 5880693). The shelves are provided in an up-down direction and a left-right direction, and include a storage shelf capable of placing an article thereon by the crane and a carry-in/out port used for an overhead transport vehicle running along a track placed on the ceiling or near the ceiling to put down and place an article thereon. The crane transfers articles between the storage shelf and the carry-in/out port.

In the stocker disclosed in JP '693, the shelves are installed on the floor of a building, and the crane runs along the track placed on the floor. Hence, an installation space to install the shelves and the crane needs to be secured on the floor.

It could therefore be helpful to provide a stocker system capable of improving storage efficiency of articles by installing a stocker on the upper side to store a plurality of articles with high density while eliminating the area necessary for installing the stocker on the floor of a building.

SUMMARY

We thus provide:

A stocker system includes a stocker capable of storing articles transported by an overhead transport vehicle. The overhead transport vehicle includes a grip to grip an upper part of an article from an upper side and a lift driver to raise and lower the grip. The overhead transport vehicle runs in a track placed on a ceiling of a building and puts down and places an article onto a load port of a device installed below the track. The stocker is disposed above the device and includes: a plurality of shelves provided in multiple stages in an up-down direction, to place articles thereon; and a crane to place an article on the shelves or take out an article placed on the shelves. The shelves include: a carry-in/out port used for the overhead transport vehicle to place an article thereon; and storage shelves used for the crane to place an article thereon. The carry-in/out port is provided to have a vertical dimension that allows the grip to put down an article from above and place the article thereon. More storage shelves are provided than the carry-in/out port, and the storage shelves are provided to have a vertical dimension smaller than the vertical dimension of the carry-in/out port. The crane includes a transfer device to place an article thereon and put down and place the article onto the carry-in/out port or the storage shelves. The crane places an article placed on the carry-in/out port by the overhead transport vehicle onto the storage shelves or takes out an article placed on the storage shelves and places the article on the carry-in/out port.

The track may be located immediately above the load port, the carry-in/out port may be disposed below and lateral to the track, and the overhead transport vehicle may include a lateral extender to extend the lift driver laterally to the track, and extend the lift driver laterally by the lateral extender to lower the grip, to put down and place an article on the carry-in/out port or receive an article placed on the carry-in/out port. The storage shelves may be provided in multiple stages on at least one of an upper side and a lower side of the carry-in/out port.

The carry-in/out port may be disposed immediately below the track, and the overhead transport vehicle may include a lateral extender to extend the lift driver laterally to the track, and extend the lift driver laterally by the lateral extender to lower the grip, to put down and place an article on the load port or receive an article placed on the load port. The storage shelves may be provided in multiple stages on a lower side of the carry-in/out port.

The crane may run in a circulating track, and the shelves may be provided correspondingly to straight sections of the circulating track. A second storage shelf capable of placing an article thereon or taking out an article therefrom by the crane may be provided on an opposite side of the carry-in/out port across a running region of the crane.

In the stocker system, the stocker is disposed above the device. Hence, a large-capacity stocker capable of carrying in and out articles by the overhead transport vehicle can be implemented without being installed on the floor, and a part of the floor of a building can be used for applications other than the installation of the stocker, for example, a space below the stocker can be used as a worker passage. The vertical dimension of the storage shelf is smaller than that of the carry-in/out port. Hence, even when the storage shelves are provided in multiple stages, the dimension in the up-down direction can be suppressed. As a result, by storing articles in the storage shelves, the articles can be stored with high density to improve storage efficiency of the articles.

In the configuration in which the track is located immediately above the load port, the carry-in/out port is disposed below and lateral to the track, and the overhead transport vehicle includes the lateral extender to extend the lift driver laterally to the track, and extends the lift driver laterally by the lateral extender to grip the grip, to put down and place an article on the carry-in/out port or receive an article placed on the carry-in/out port, the track for the overhead transport vehicle deviates from the carry-in/out port. Hence, even when the carry-in/out port and the storage shelves are provided in multiple stages in the up-down direction, the running of the overhead transport vehicle is not hindered and many storage shelves can be secured. In the configuration in which the storage shelves are provided in multiple stages on at least one of the upper side and the lower side of the carry-in/out port, the vertical dimension of the storage shelf is smaller than that of the carry-in/out port. Hence, articles can be stored with high density by increasing the number of stages of the storage shelves.

In the configuration in which the carry-in/out port is disposed immediately below the track, and the overhead transport vehicle includes the lateral extender to extend the lift driver laterally to the track, and extends the lift driver laterally by the lateral extender to lower the grip, to put down and place an article on the load port or receive an article placed on the load port, the carry-in/out port is disposed immediately below the track. Hence, the overhead transport vehicle can deliver and receive an article to and from the carry-in/out port simply by lowering the grip. In the configuration in which the storage shelves are provided in multiple stages on the lower side of the carry-in/out port, articles can be stored with high density by increasing the number of stages of the storage shelves whose vertical dimension is smaller than that of the carry-in/out port.

In the configuration in which the crane runs in the circulating track and the shelves are provided correspondingly to the straight sections of the circulating track, when the crane circulates, the crane can be easily located at any of the shelves, and furthermore, the shelves are provided in the straight sections. Hence, the installation and the structure of the shelves can be simplified to reduce the cost. In the configuration in which the second storage shelf capable of placing an article thereon or taking out an article therefrom by the crane is provided on the opposite side of the carry-in/out port across the running region of the crane, an article can be stored in the second storage shelf. Hence, a large-capacity stocker can be implemented.

DESCRIPTION OF REFERENCE SIGNS

Figure 1:
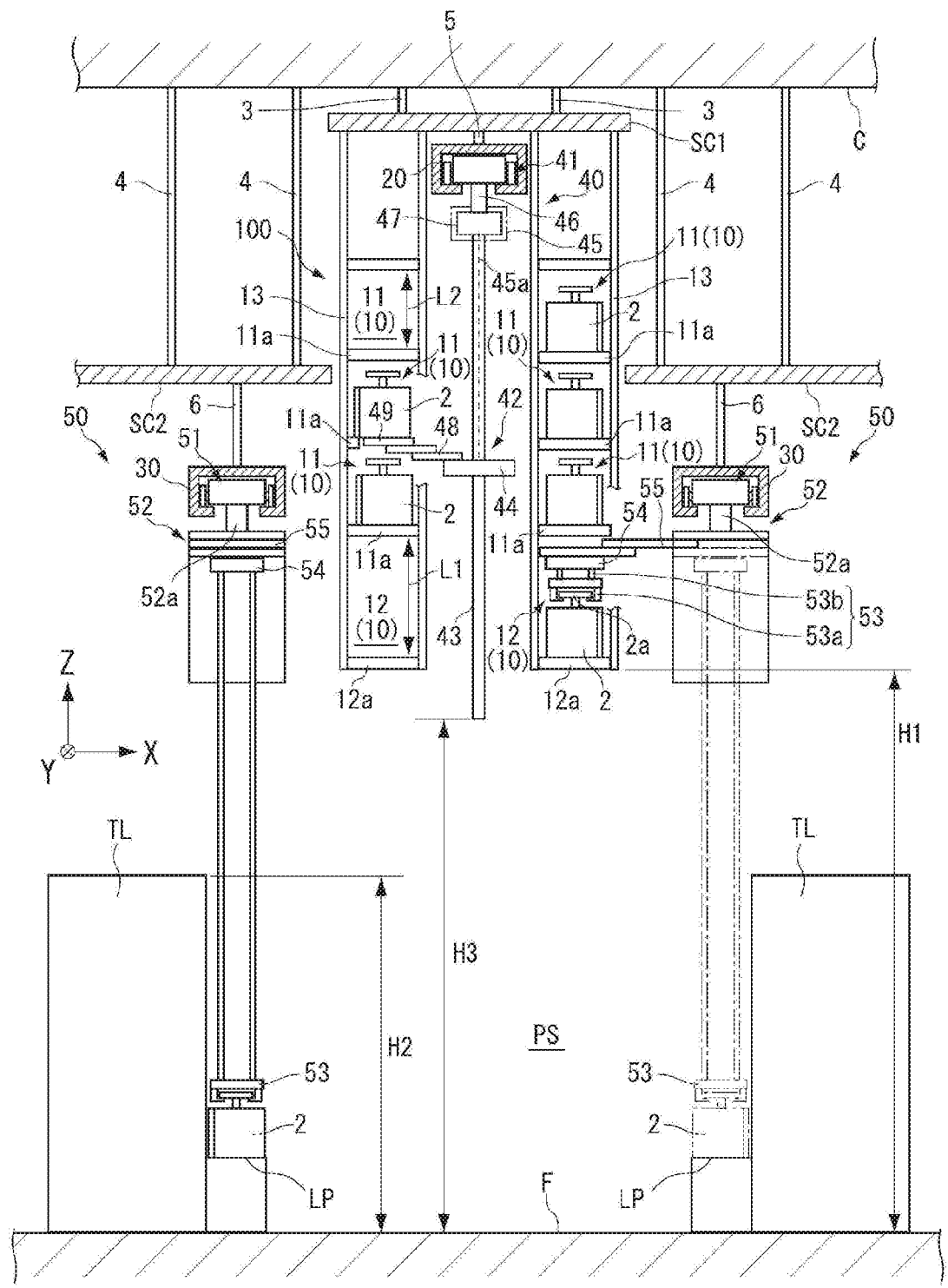
FIG. 1 is a view illustrating an example of a stocker system according to a first configuration as seen from a Y direction.

C: ceiling
F: floor
SC1, SC2, SC3: system ceiling
LP: load port
TL: processing device (device)
PS: worker passage
PSA: main passage
SYS, SYS2, SYS3, SYS4: stocker system
2: article
10: plurality of shelves
11: storage shelf
11S: second storage shelf
12: carry-in/out port
20: crane ceiling track
20A: crane circulating ceiling track (circulating track)
21: straight section
22: connection section
30, 30A, 30B: circulating ceiling track (track)
31, 31A, 31B: straight part
32, 32A, 32B: connection
40: crane
41: traveler
42: transfer device
43: mast
44: hoisting table
45: lift driver
48: extender
49: placement table
50: overhead transport vehicle
51: transport vehicle traveler
52: main body
53: grip
54: lift driver
55: lateral extender
100, 100A, 100B, 100C: stocker

DETAILED DESCRIPTION

Examples/configurations are described below with reference to the drawings. This disclosure is not limited to the examples/configurations. In the drawings, some parts are enlarged or emphasized with scales appropriately changed for the description of the examples/configurations. In each figure referred to below, directions in the figure are described by using an XYZ coordinate system. In the XYZ coordinate system, the vertical direction is a Z direction, and the horizontal directions are an X direction and a Y direction. The Y direction is one of the horizontal directions and is a direction along a crane ceiling track 20 described later. The X direction is a direction orthogonal to the Y direction. Regarding the X, Y, and Z directions, directions indicated by the arrows are indicated as + directions (for example, +X direction) and the opposite directions are indicated by − directions (for example, −X direction) as appropriate.

First Example

Figure 2:
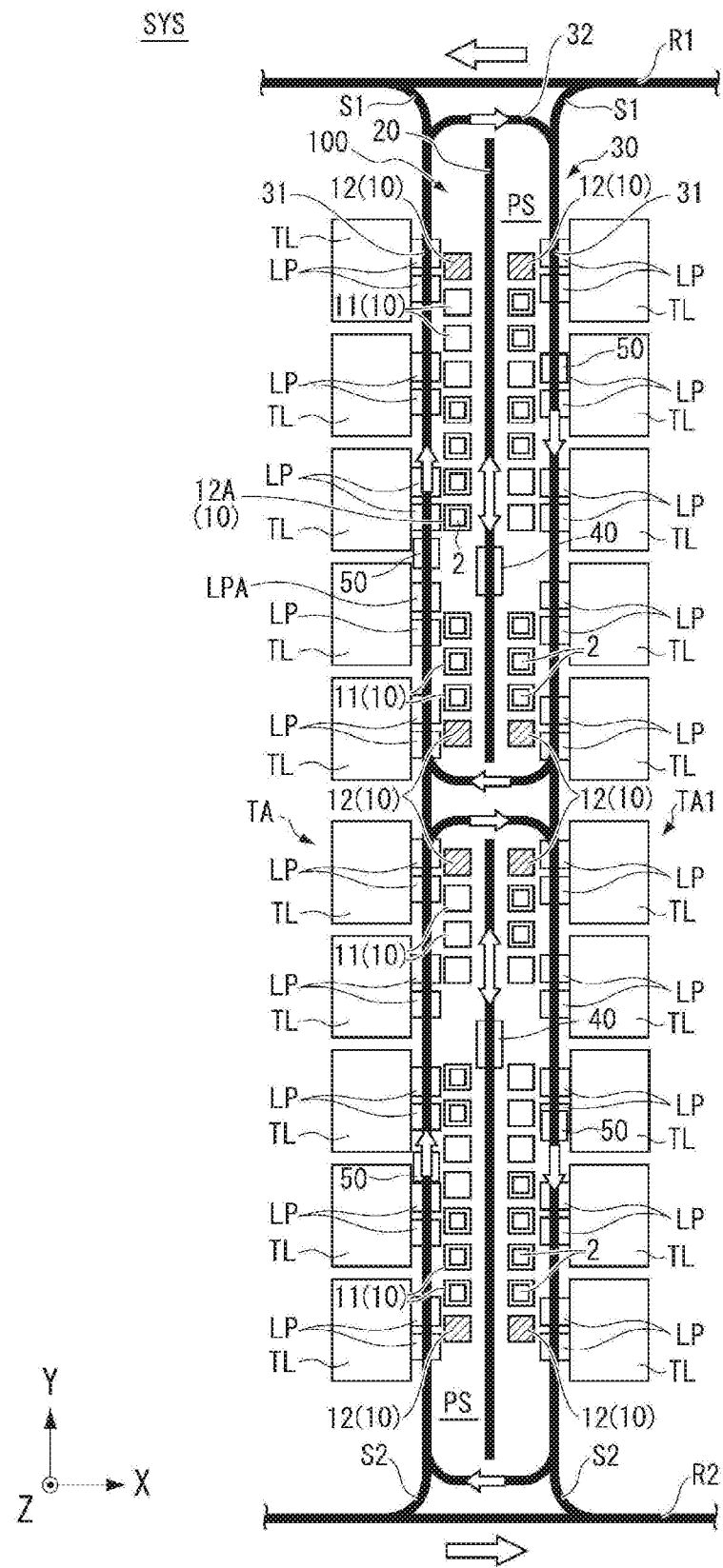
FIG. 2 is a view schematically illustrating the stocker system illustrated in FIG. 1 in plan view.

FIG. 1 is a view illustrating an example of a stocker system SYS according to a first configuration as seen from the Y direction. FIG. 2 is a view schematically illustrating the stocker system SYS in plan view. For example, the stocker system SYS illustrated in FIGS. 1 and 2 is provided in a manufacturing factory for semiconductor devices, and stores therein articles 2 such as FOUPs storing semiconductor wafers used to manufacture semiconductor devices or reticle pods storing reticles. The stocker system SYS is provided to be connected to a transportation system to transport articles 2. An example where the articles 2 are FOUPs is described, but the articles 2 may be other than FOUPs. The stocker system SYS is also applicable to facilities in fields other than the semiconductor manufacturing field, and the articles 2 may be other articles that can be stored in the stocker system SYS.

As illustrated in FIGS. 1 and 2, the stocker system SYS includes a stocker 100. The stocker 100 includes a plurality of shelves 10, the crane ceiling track 20, and a crane 40. As illustrated in FIG. 2, in plan view, the shelves 10 are provided on the inner side of a circulating ceiling track (track) 30 in which an overhead transport vehicle 50 runs, and are disposed between the crane ceiling track 20 and the circulating ceiling track 30. As illustrated in FIG. 1, the shelves 10 are held by frames 13, and disposed in four stages in an up-down direction (Z direction). The plurality of shelves 10 are disposed side by side along a running direction (Y direction) of the crane 40 described later. The shelf 10 is used to mean a space to place and storing an article 2 therein or a storage space. In other words, the shelf 10 is a storage space for articles 2 that is formed by combining surfaces on which the articles 2 are placed (for example, top surfaces of shelf plates 11a and 12a) and a space to the ceiling upward of the surfaces (for example, bottom surfaces of shelf plates 11a and 12a).

The shelves 10 each include a storage shelf 11 and a carry-in/out port 12 to place an article 2 thereon. The storage shelf 11 and the carry-in/out port 12 include the shelf plates 11a and 12a to place articles 2 thereon, respectively, and have vertical dimensions from the top surfaces of the shelf plates 11a and 12a to the bottom surfaces of the shelf plate 11a above the top surfaces. In the following description, placing an article 2 on the storage shelf 11 or the carry-in/out port 12 means placing an article 2 on the shelf plate 11a of the storage shelf 11 or the shelf plate 12a of the carry-in/out port 12. The shelf plates 11a and 12a of the storage shelf 11 and the carry-in/out port 12 may be provided with a plurality of pins to be fitted to grooves provided in the bottom surface of an article 2 when the article 2 is placed. When the pins are fitted to the grooves of the article 2, the article 2 is positioned with respect to the storage shelf 11 or the carry-in/out port 12.

The shelves 10 are provided while being suspended from a system ceiling SC1 by frames 13. The system ceiling SC1 is disposed while being suspended from a ceiling C of a building by a hanging hook 3. The frame 13 may be suspended from the ceiling C instead of being suspended from the system ceiling SC1. The height of a lower end of the shelves 10 from the floor F is set to a height H1. The height H1 is set to be higher than a height H2 of a processing device TL from the floor F. A height H3 of a lower end of the crane 40 described later is also set to be higher than the height H2 of the processing device TL. In other words, the stocker 100 is disposed above the processing device TL. The height H3 may secure a height to form a worker passage PS through which workers can pass on the floor F without any problem. As a result, a space below the stocker 100 can be used as the worker passage PS.

The shelves 10 include storage shelves 11 in three vertical stages and a carry-in/out port 12 in the lowermost stage disposed below the storage shelves 11. The number of the stages of the storage shelves 11 can be freely set and, for example, four or more stages may be provided above the carry-in/out port 12. The storage shelves 11 may be provided in multiple stages below the carry-in/out port 12 if there is an installation space. The carry-in/out port 12 is a port to deliver and receive an article 2 to and from the overhead transport vehicle 50 running in the circulating ceiling track 30. The carry-in/out port 12 may be disposed at the lowermost stage of the shelves 10, but this configuration is not limited to this arrangement. The carry-in/out port 12 is set depending on the height of the overhead transport vehicle 50 running in the circulating ceiling track 30. Thus, for example, by changing the height of the overhead transport vehicle 50, the carry-in/out port 12 can be set at the middle stage or the topmost stage other than the lowermost stage.

Figure 3:
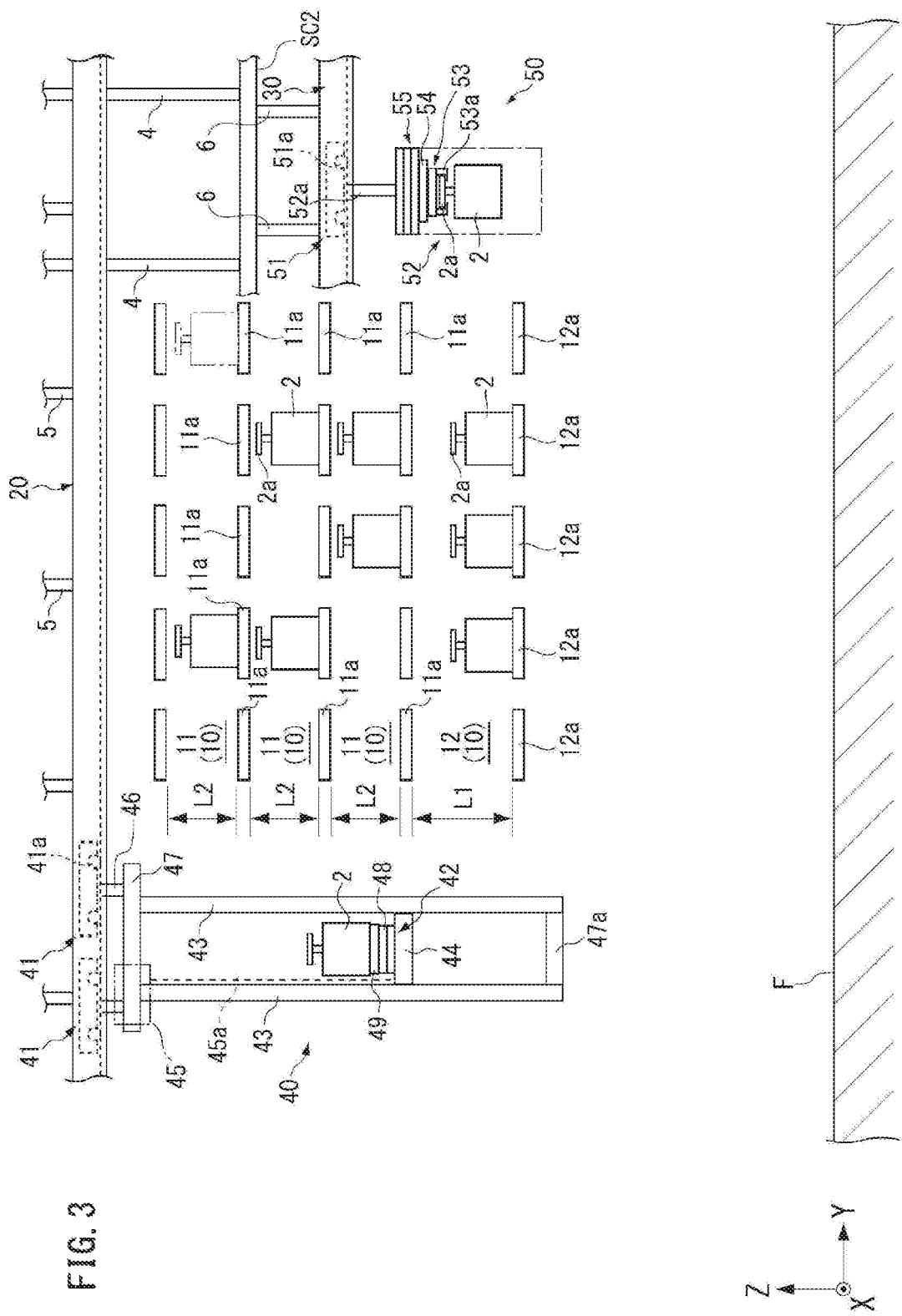
FIG. 3 is a view of carry-in/out ports and storage shelves as seen from an X direction.

FIG. 3 is a view of the storage shelves 11 and the carry-in/out ports 12 as seen from the X direction. In FIG. 3, the frames 13 of the shelves 10 are omitted. The carry-in/out port 12 is disposed in the lowermost stage of the shelves 10 in the up-down direction. In FIG. 2, the carry-in/out ports 12 are illustrated on both ends in the running direction (Y direction) of the crane 40, but the lowermost stage of the shelves 10 is the carry-in/out port 12. A part of the lowermost stages of the shelves 10 may be the storage shelf 11. Both of the crane 40 and the overhead transport vehicle 50 can deliver and receive an article 2 to and from the carry-in/out port 12. The carry-in/out port 12 is provided with a vertical dimension (length in the up-down direction) L1 as illustrated in FIG. 3. The vertical dimension L1 is a dimension necessary for a part of a grip 53, a lift driver 54, and a lateral extender 55 of the overhead transport vehicle 50 described later to enter the upper side of the carry-in/out port 12 to raise and lower the article 2.

All or part of the shelves 10 other than the carry-in/out port 12 are the storage shelves 11. The storage shelf 11 cannot deliver or receive an article 2 by the overhead transport vehicle 50 but delivers and receives an article 2 by the crane 40. The storage shelf 11 is provided with a vertical dimension L2 as illustrated in FIG. 3. The vertical dimension L2 of the storage shelf 11 is smaller than the vertical dimension L1 of the carry-in/out port 12. The vertical dimension L2 is a dimension necessary for a transfer device 42 in the crane 40 described later to raise an article 2. The transfer device 42 in the crane 40 is configured to raise a part of the article 2. Hence, a large space is not required above the article 2. For example, the vertical dimension L2 may be a dimension obtained by adding several centimeters to the vertical dimension of the article 2.

In this manner, the storage shelf 11 has the vertical dimension L2 smaller than the vertical dimension L1. Hence, even when a space to the ceiling C (or such as system ceiling SC1) of a building when the stocker 100 (shelves 10) is disposed above the processing device TL is limited, the storage shelves 11 can be efficiently provided in the space in multiple stages in the up-down direction. As a result, articles 2 can be stored in the shelves 10 with high density, and the storage efficiency of the articles 2 can be improved.

As illustrated in FIG. 1, the crane ceiling track 20 is provided while being suspended from the system ceiling SC1 by the hanging hook 5. The crane ceiling track 20 may be suspended from the ceiling C instead of being suspended from the system ceiling SC1. As illustrated in FIG. 2, the crane ceiling track 20 is a straight track extending in the Y direction and is provided in a range accommodated on the inner side of the circulating ceiling track 30 in plan view. In other words, the crane ceiling track 20 has a configuration in which a part thereof does not extend to the outer side of the circulating ceiling track 30 in plan view or the crane 40 running in the crane ceiling track 20 cannot move to the outer side of the circulating ceiling track 30. Thus, ends of the crane ceiling track 20 on the +Y side and the −Y side are disposed on the inner side of the circulating ceiling track 30 in plan view, and a track between the ends is also disposed on the inner side of the circulating ceiling track 30 in plan view.

The crane ceiling track 20 is a straight track. Hence, even when the range inside the circulating ceiling track 30 in plan view is narrow, the crane ceiling track 20 and the crane 40 can be installed to be accommodated in the range (or such that a part of track is not disposed on outer side of circulating ceiling track 30). As illustrated in FIG. 1, the height of the crane ceiling track 20 from the floor F is different from that of the circulating ceiling track 30. The height of the crane ceiling track 20 from the floor F may be higher than that of the circulating ceiling track 30. However, this example is not limited to this configuration. For example, the height of the crane ceiling track 20 from the floor F may be lower than that of the circulating ceiling track 30 or may be the same height as the circulating ceiling track 30.

The crane 40 runs in the crane ceiling track 20 to move while holding an article 2. The crane 40 transfers an article 2 between a storage shelf 11 and another storage shelf 11 or between a storage shelf 11 and a carry-in/out port 12. The crane 40 can run in the crane ceiling track 20 in the +Y direction and the −Y direction and can reciprocate. The number of the cranes 40 disposed in one crane ceiling track 20 is not limited to one. For example, two or more cranes 40 may be disposed in one crane ceiling track 20.

As illustrated in FIG. 3, in side view (as seen from X direction or as seen from direction orthogonal to running direction of crane 40), the crane 40 is provided at such a height that a part of the crane 40 overlaps one or both of the circulating ceiling track 30 and the overhead transport vehicle 50. This configuration can suppress the dimension of the stocker 100 (shelves 10) in the up-down direction with respect to the circulating ceiling track 30, and can easily set a height H1 of lower ends of the shelves 10 and a height H3 of lower ends of masts 43 of the crane 40 to be equal to or higher than a height H2 of a processing device TL.

As illustrated in FIG. 1, the crane 40 includes a transfer device 42 that is provided while being suspended from the traveler 41 to deliver and receive an article 2 to and from the storage shelf 11 or the carry-in/out port 12. The transfer device 42 has the masts 43. The masts 43 are provided such that the height of lower ends thereof from the floor F is the height H3. The lower ends of the masts 43 are the lower end of the crane 40, and the height of the crane 40 from the floor F is the height H3. The height H3 is higher than the height H1 of the processing device TL as described above.

Figure 4:
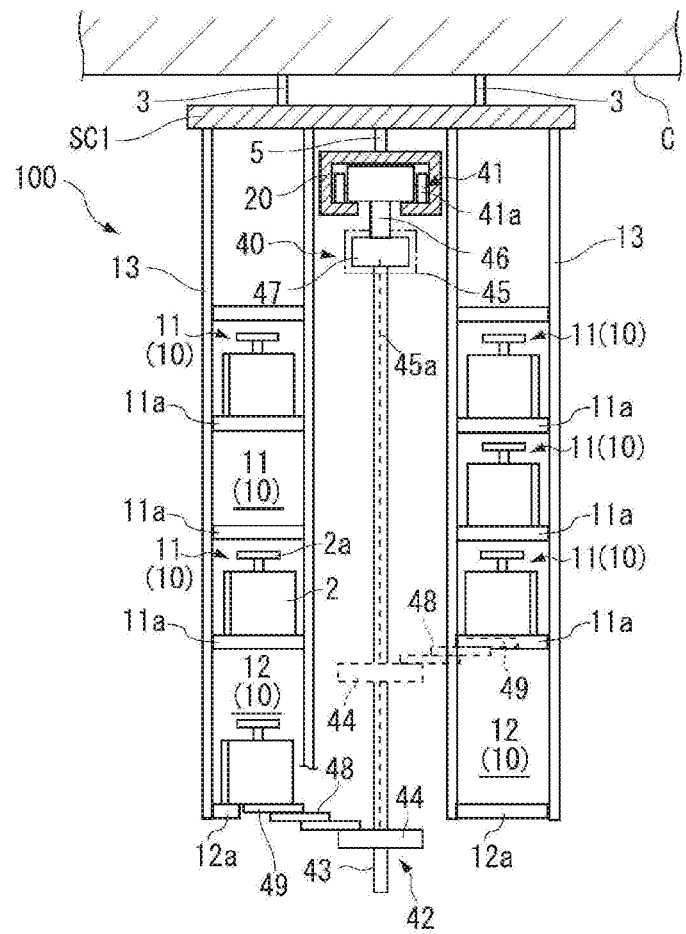
FIG. 4 is a view of a crane as seen from the Y direction.
Figure 4:
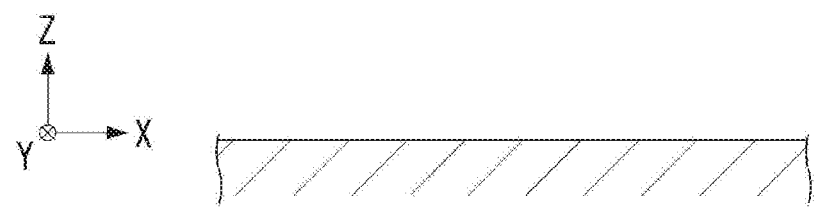

FIG. 4 is a view illustrating an example of the crane 40. As illustrated in FIG. 4, the crane 40 runs in the crane ceiling track 20 placed on the ceiling C side. Hence, a track does not need to be provided on the floor F side (ground side). The crane 40 includes two travelers 41 (see FIG. 3) and a transfer device 42. An upper support 47 is mounted below the traveler 41 through a mounter 46, and the two travelers 41 are coupled by the upper support 47. Each traveler 41 includes a running driver (not shown) and a plurality of wheels 41a and runs along the crane ceiling track 20. For example, the running driver may be an electric motor provided to the traveler 41 to drive the wheels 41a, or may be a linear motor provided by using the crane ceiling track 20.

The crane 40 in this example uses the two travelers 41 and can thus reliably support the heavy transfer device 42 and the article 2. The two travelers 41 are used for the crane 40, but the example is not limited to this configuration. One or three or more travelers 41 may be used.

The transfer device 42 includes masts 43, a hoisting table 44, a lift driver 45, an extensible portion 48, and a placement table 49. The masts 43 extend in the up-down direction while being suspended from the upper support 47, and the two masts 43 are provided on the front and back sides in the running direction of the traveler 41 (see FIG. 3). The mast 43 is formed into a hollow or solid rod shape, and the cross-section thereof is formed into a circular, oval, or elliptical shape or a polygonal shape such as a rectangular shape. The mast 43 may be mounted to the upper support 47 by using a fastening member such as a bolt and a nut or by using welding. The number of the masts 43 may be one.

Figure 5:
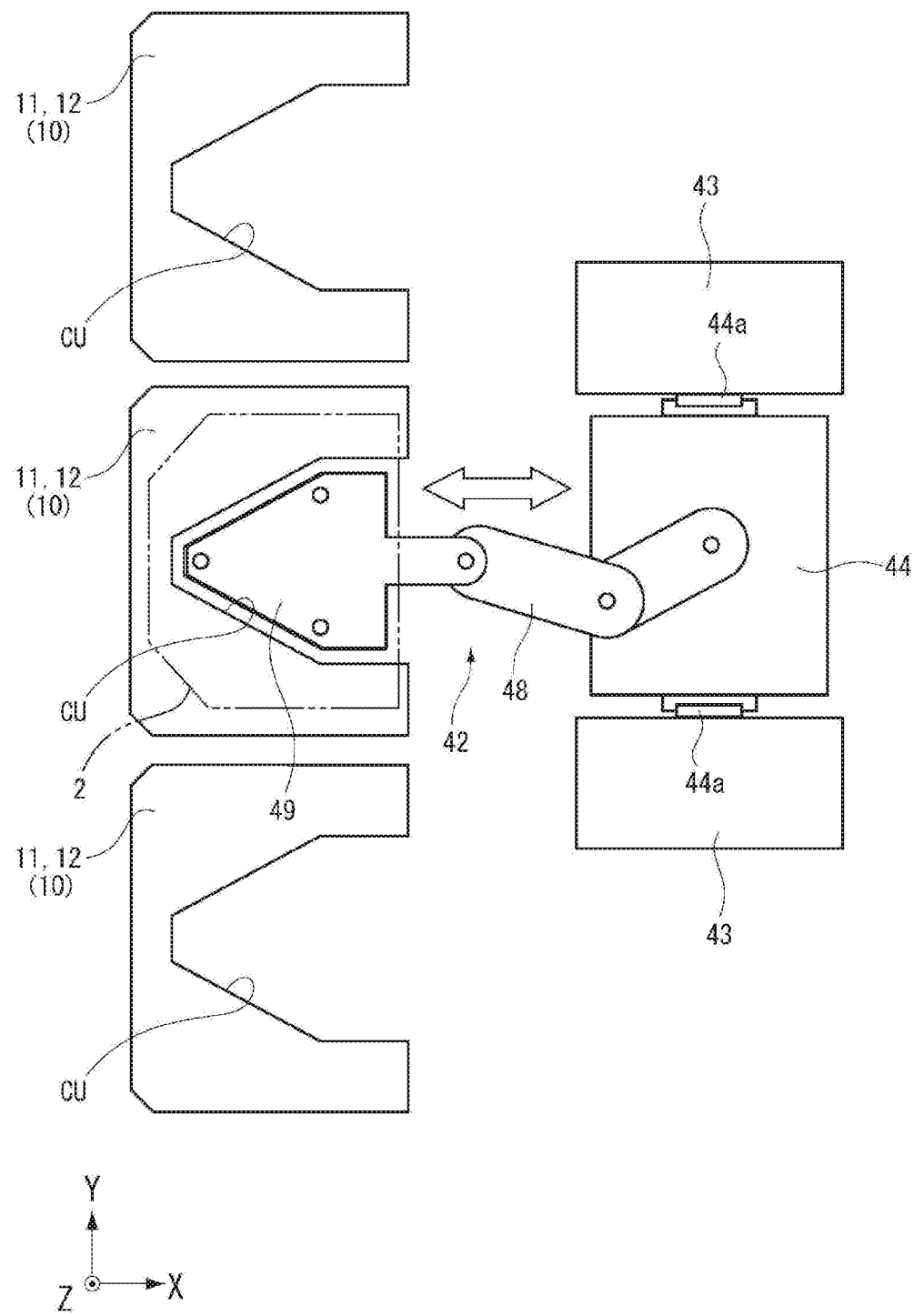
FIG. 5 is a plan view illustrating an example of a transfer device provided to the crane.

FIG. 5 is a plan view illustrating an example of the transfer device 42 included in the crane 40. The hoisting table 44 in the transfer device 42 is disposed while being sandwiched by the two masts 43 and is capable of rising and lowering by being guided by the masts 43. The transfer device 42 is mounted on the top surface side of the hoisting table 44. The hoisting table 44 includes guide rollers 44a in contact with the surfaces of the masts 43, and smoothly performs the rising and lowering operation along the masts 43. The lower support 47a is provided at the lower part of the masts 43 (see FIG. 3), and the hoisting table 44 is capable of lowering to the position contacting the lower support 47a. The lower support 47a prevents the hoisting table 44 from falling off from the mast 43 downward.

The extensible portion 48 includes a plurality of arms capable of elongating and contracting in a direction orthogonal to the running direction of the traveler 41. The placement table 49 is provided at the distal end of the extensible portion 48. The placement table 49 is a triangular plate-shaped member on which an article 2 can be placed. The placement table 49 holds an article 2 when the article 2 is placed. On the top surface of the placement table 49, pins 49a to be inserted to grooves in the bottom surface of the article 2 to position the article 2 are provided. The storage shelf 11 and the carry-in/out port 12 described above are provided with a cutout CU through which the placement table 49 can pass in the up-down direction.

When receiving an article 2 from the storage shelf 11 or the carry-in/out port 12, the transfer device 42 raises the hoisting table 44 while extending the extensible portion 48 to locate the placement table 49 below the article 2, thereby taking up the article 2 by the placement table 49. Subsequently, the transfer device 42 contracts the extensible portion 48 while the article 2 is still placed on the placement table 49 and disposes the placement table 49 having the article 2 placed thereon upward of the hoisting table 44. When delivering an article 2 to the storage shelf 11 or the carry-in/out port 12, the transfer device 42 performs operation reverse to the above-mentioned operation. The transfer device 42 is not limited to the above-mentioned configuration.

Figure 6:
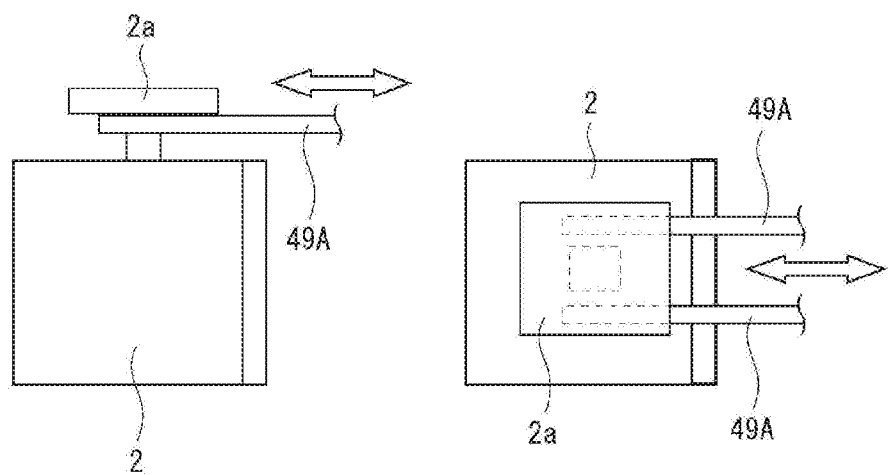
FIG. 6(A) is a view illustrating another example of the transfer device.
FIG. 6(B) is a view illustrating still another example of the transfer device.
Figure 6:
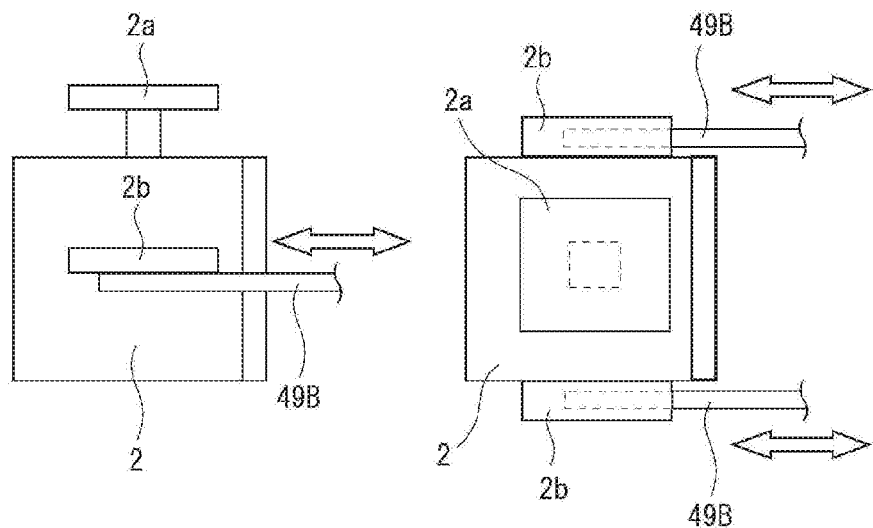

FIGS. 6(A) and 6(B) are views illustrating other examples of the transfer device. As illustrated in FIG. 6(A), a fork 49A may be provided at the distal end of the extensible portion 48 in place of the above-mentioned placement table 49. When the extensible portion 48 extends, as illustrated in FIG. 6(A), the fork 49A can enter below the flange 2a provided at the upper part of an article 2. By raising the hoisting table 44 (see FIG. 5) in this state, an article 2 in the storage shelf 11 or the carry-in/out port 12 can be raised. By lowering the hoisting table 44 from the state illustrated in FIG. 6(A), an article 2 can be placed in the storage shelf 11 or the carry-in/out port 12.

As illustrated in FIG. 6(B), a fork 49B may be mounted to the distal end of the extensible portion 48 in place of the above-mentioned placement table 49. When the extensible portion 48 extends, as illustrated in FIG. 6(B), the fork 49B can enter below the side flange 2b provided to the side surface of an article 2. By raising the hoisting table 44 (see FIG. 5) in this state, an article 2 in the storage shelf 11 or the carry-in/out port 12 can be raised. By lowering the hoisting table 44 from the state illustrated in FIG. 6(B), an article 2 can be placed in the storage shelf 11 or the carry-in/out port 12.

For example, the lift driver 45 uses a hoist, raises and lowers the hoisting table 44 along the masts 43. The lift driver 45 includes a suspension member 45a and a driver (not shown). For example, the suspension member 45a is a belt or a wire, and the hoisting table 44 is suspended from the upper support 47 through the suspension member 45a. For example, the driver (not shown) is provided to the upper support 47, and feeds and winds the suspension member 45a. When the driver feeds the suspension member 45a, the hoisting table 44 is guided by the masts 43 to lower. When the driver winds the suspension member 45*a*, the hoisting table 44 is guided by the masts 43 to rise. The lift driver 45 is controlled by a control device (not shown) to lower or raise the hoisting table 44 at predetermined speed. The lift driver 45 is controlled by the control device to hold the hoisting table 44 at a target height.

As illustrated in FIG. 4, the lift driver 45 is provided to the upper support 47 (traveler 41). The lift driver 45 may be provided to the hoisting table 44, for example, instead of being provided to the upper support 47. As the configuration in which the lift driver 45 is provided to the hoisting table 44, for example, a belt or a wire suspended from the upper support 47 may be wound or fed by a hoist mounted to the hoisting table 44 to raise or lower the hoisting table 44. An electric motor to drive a pinion gear may be mounted to the hoisting table 44, and a rack to be engaged with the pinion gear may be formed in the mast 43 so that the hoisting table 44 is raised or lowered by driving the electric motor to rotate the pinion gear.

As illustrated in FIG. 1, the circulating ceiling track 30 is provided while being suspended from a system ceiling SC2 by a hanging hook 6. The system ceiling SC2 is provided while being suspended from the ceiling C by a hanging hook 4. The circulating ceiling track 30 may be suspended from the ceiling C instead of being suspended from the system ceiling SC2.

As illustrated in FIG. 2, the circulating ceiling tracks 30 are provided along regions immediately above load ports LP opposed to each other with a predetermined gap (worker passage PS). The load ports LP may be provided at two locations on one processing device TL, but the example is not limited to this form. For example, the load port LP may be provided at one location on one processing device TL, or the load ports LP may be provided at three or more locations. The circulating ceiling track 30 is provided immediately above the load port LP, and hence an article 2 can be delivered and received to and from the load port LP simply when the overhead transport vehicle 50 in the circulating ceiling track 30 raises and lowers the article 2, and an article 2 can be delivered and received to and from the carry-in/out port 12 by extending the grip 53 laterally (lateral transfer).

The circulating ceiling track 30 is disposed between an inter-bay route (inter-bay track) R1 and an inter-bay route R2 in plan view. The circulating ceiling track 30 has branches only on the outer side in plan view. In other words, the circulating ceiling track 30 does not branch on the inner side in plan view and is a minimum unit of circulating ceiling track. The circulating ceiling tracks 30 are each provided in a bay (intra-bay), and the inter-bay route R1 is provided to connect a plurality of the circulating ceiling tracks 30. The circulating ceiling track 30 is connected from the inter-bay route R1 through two branch lines S1 for entry and exit and connected from the inter-bay route R2 through two branch lines S2 for entry and exit.

The circulating ceiling track 30 has straight parts 31 and connections 32. The overhead transport vehicle 50 can circulate and run in one direction (for example, counter-clockwise direction in plan view) along the straight parts 31 and the connections 32. The straight parts 31 are disposed immediately above the load ports LP in the Y direction along the load ports LP. The two straight parts 31 are disposed in parallel to the crane ceiling track 20. The connections 32 include curves and are disposed on both ends on the +Y side and the −Y side to connect the two straight parts 31.

The overhead transport vehicle 50 enters the circulating ceiling track 30 from the inter-bay routes R1 and R2 through the branch lines S1 and S2, or exits from the circulating ceiling track 30 to the inter-bay routes R1 and R2 through the branch lines S1 and S2. The overhead transport vehicle 50 transports an article 2 from another place (for example, another stocker connected to inter-bay route R1), and delivers the article 2 to the load port LP of the processing device TL or the carry-in/out port 12. The overhead transport vehicle 50 transports an article 2 on the load port LP of the processing device TL or the carry-in/out port 12 to another place. The overhead transport vehicle 50 moves along the circulating ceiling track 30 and transfers an article 2 between the load port LP and the carry-in/out port 12.

Figure 7:
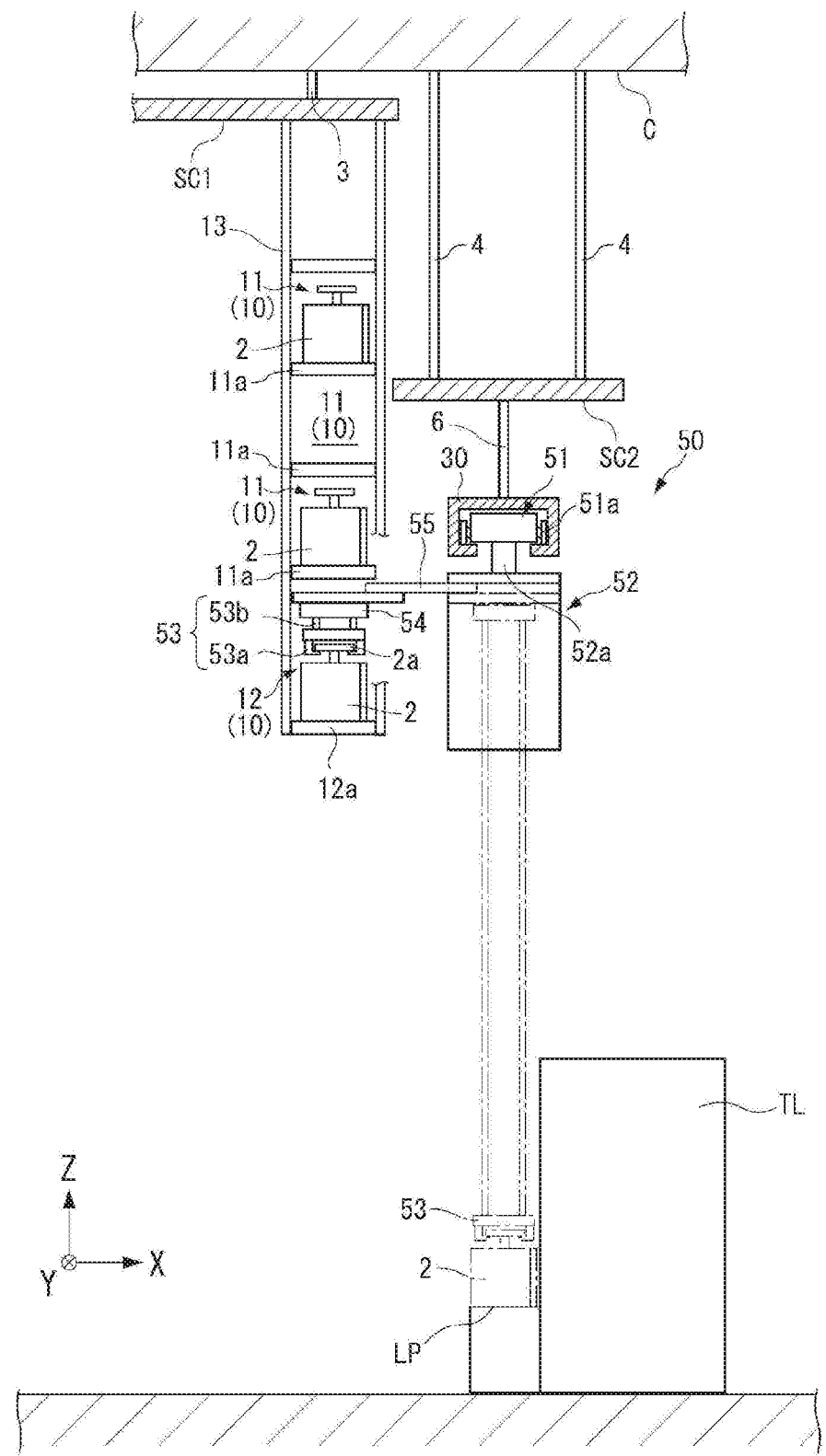
FIG. 7 is a view of an overhead transport vehicle as seen from the Y direction.

FIG. 7 is a view illustrating an example of the overhead transport vehicle 50. As illustrated in FIG. 7, the overhead transport vehicle 50 has a transport vehicle traveler 51 and a main body 52. The same configuration as the traveler 41 of the crane 40 is applied to the transport vehicle traveler 51, and includes a running driver (not shown) and a plurality of wheel 51*a* and runs along the circulating ceiling track 30. For example, the running driver may be an electric motor provided in the transport vehicle traveler 51 to drive the wheels 51*a*, or may be a linear motor provided by using the circulating ceiling track 30.

The main body 52 is mounted to the lower part of the transport vehicle traveler 51 through a mounter 52*a*. The main body 52 has a grip 53 that holds an article 2, a lift driver 54 that suspends the grip 53 to raise and lower the grip 53, and a lateral extender 55 that moves the lift driver 54 laterally to the track. The grip 53 grips the flange 2*a* of the article 2 from the above to hold the article 2 while suspending the article 2. For example, the grip 53 is a chuck having a plurality of claws 53*a* capable of reciprocating in the horizontal direction, and when the claw 53*a* is caused to enter below the flange 2*a* of the article 2 and the grip 53 is raised, the grip 53 holds the article 2 in the suspended state. The grip 53 is connected to a suspension member 53*b* such as a wire or a belt. The grip 53 rises and lowers while being suspended from the lift driver 54.

For example, the lift driver 54 is a hoist and feeds the suspension member 53*b* to lower the grip 53, and winds the suspension member 53*b* to raise the grip 53. The lift driver 54 is controlled by a control device (not shown) to lower or raise the grip 53 at predetermined speed. The lift driver 54 is controlled by the control device to hold the grip 53 at a target height.

For example, the lateral extender 55 has movable plates disposed to overlap in the up-down direction. The movable plates are movable lateral to the running direction of the transport vehicle traveler 51 (direction orthogonal to running direction). The lift driver 54 is mounted to the movable plate. The main body 52 has a guide (not shown) to guide the lateral extender 55 and a driver (not shown) to drive the lateral extender 55. The lateral extender 55 uses driving power from the driver such as an electric motor to move the lift driver 54 and the grip 53 along the guide between a protrusion position and a storage position. The protrusion position is a position at which the grip 53 is caused to protrude laterally from the main body 52. The storage position is a position at which the grip 53 is stored in the main body 52. A rotator to rotate the lift driver 54 (grip 53) about an axis in the up-down direction may be provided between the lateral extender 55 and the lift driver 54.

The stocker system SYS has a control device (not shown). The control device comprehensively controls the stocker system SYS. The control device controls the operations of the crane 40 and the overhead transport vehicle 50 by wireless or wired communication. The control device may be divided into a control device that controls the crane 40 and a control device that controls the overhead transport vehicle 50.

Figure 8:
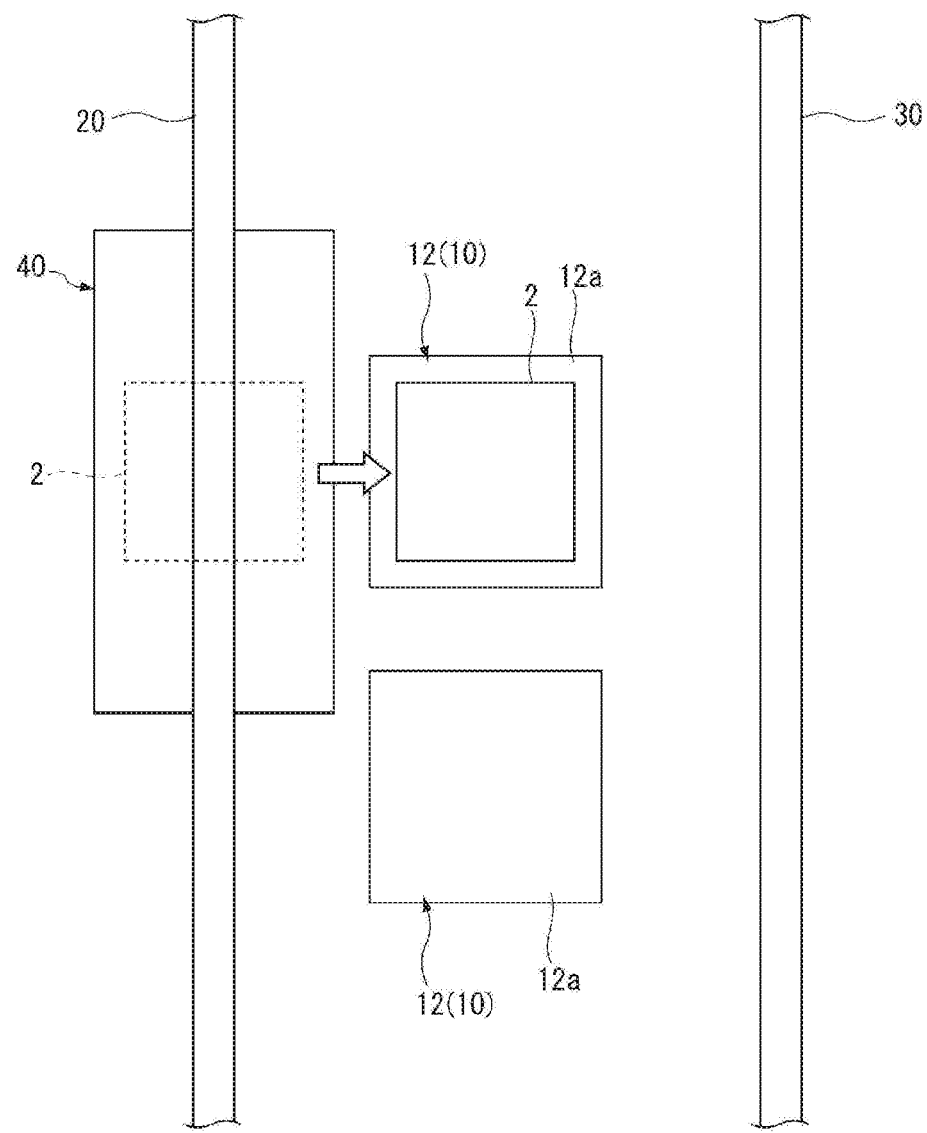
FIG. 8 is a view illustrating an operation for transferring an article from a crane to a carry-in/out port.
Figure 9:
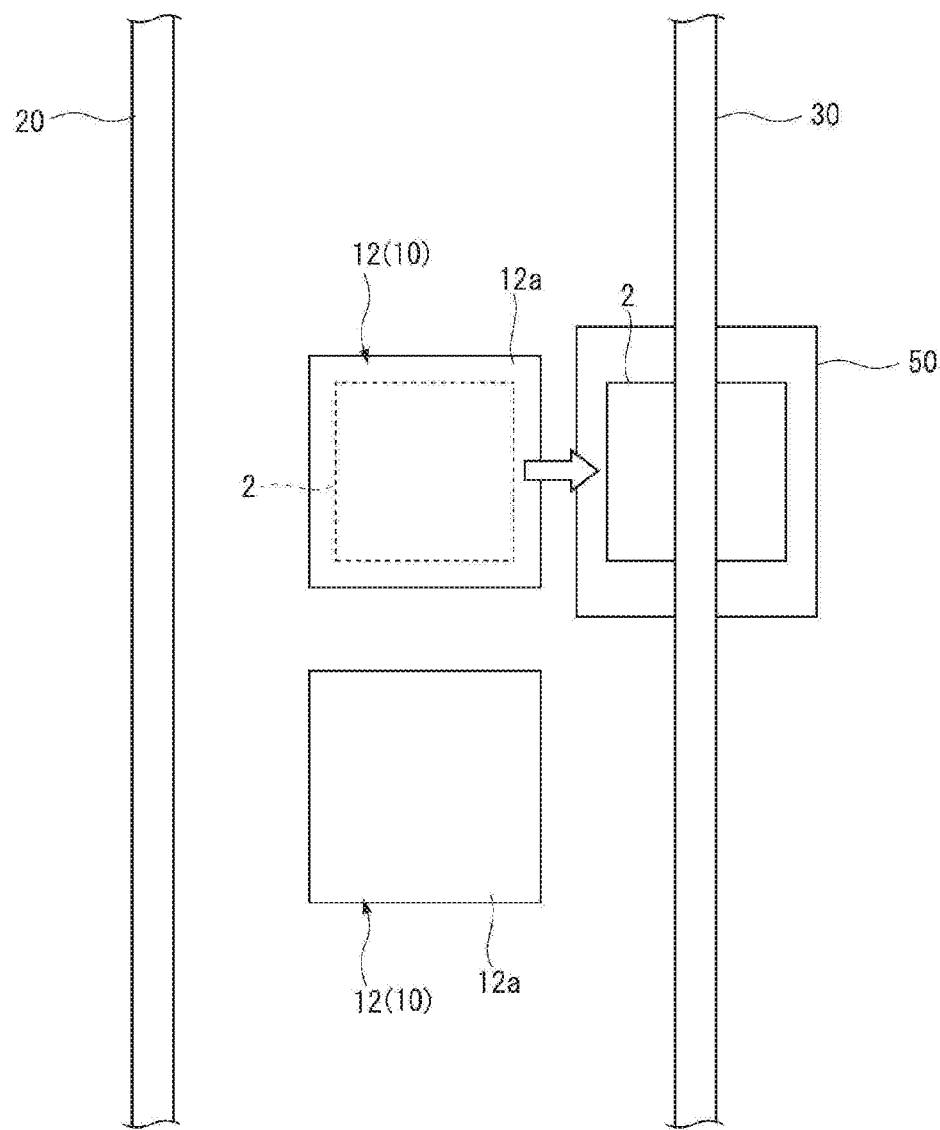
FIG. 9 is a view illustrating an operation for transferring an article from a carry-in/out port to an overhead transport vehicle.

In the above-mentioned stocker system SYS, the carry-in/out port 12 is used when an article 2 is delivered from the crane 40 to the overhead transport vehicle 50. FIGS. 8 and 9 are views illustrating an operation that delivers an article 2 from the crane 40 to the overhead transport vehicle 50. In FIGS. 8 and 9, the cutout CU (see FIG. 5) of the carry-in/out port 12 is omitted. The control device (not shown) controls the crane 40 and the overhead transport vehicle 50 to deliver an article 2 from the crane 40 to the overhead transport vehicle 50. First, the crane 40 runs in the Y direction along the crane ceiling track 20 to move to the side of the storage shelf 11 and receives an article 2 through the transfer device 42. After that, in the state in which the article 2 is placed on the placement table 49, as illustrated in FIG. 8, the crane 40 moves to the carry-in/out port 12 and stops, and extends the extensible portion 48 such that the article 2 is disposed above the carry-in/out port 12. Subsequently, the lift driver 45 is driven to lower the hoisting table 44 so that the article 2 is delivered from the placement table 49 to the carry-in/out port 12.

When an article 2 is placed in the carry-in/out port 12 by the crane 40, as illustrated in FIG. 9, the overhead transport vehicle 50 moves in the Y direction along the circulating ceiling track 30 to the side of the carry-in/out port 12 and stops, and uses the lateral extender 55 to protrude the lift driver 54 and the grip 53 to the protrusion position such that the grip 53 is disposed above the article 2. Subsequently, the lift driver 54 is driven to lower the grip 53, and a flange 2a of the article 2 is gripped by the grip 53 from the above. Subsequently, the grip 53 is raised by the lift driver 54 and, furthermore, the grip 53 is returned to the storage position by the lateral extender 55 so that the article 2 is stored in the main body 52.

Through the series of operation, the article 2 is delivered from the crane 40 to the overhead transport vehicle 50 through the carry-in/out port 12. After the article 2 is received, for example, the overhead transport vehicle 50 runs in the circulating ceiling track 30 to the load port LP of the processing device TL, and lowers the grip 53 holding the article 2 by the lift driver 54. In this manner, the article 2 can be placed on the load port LP of the processing device TL.

Figure 10:
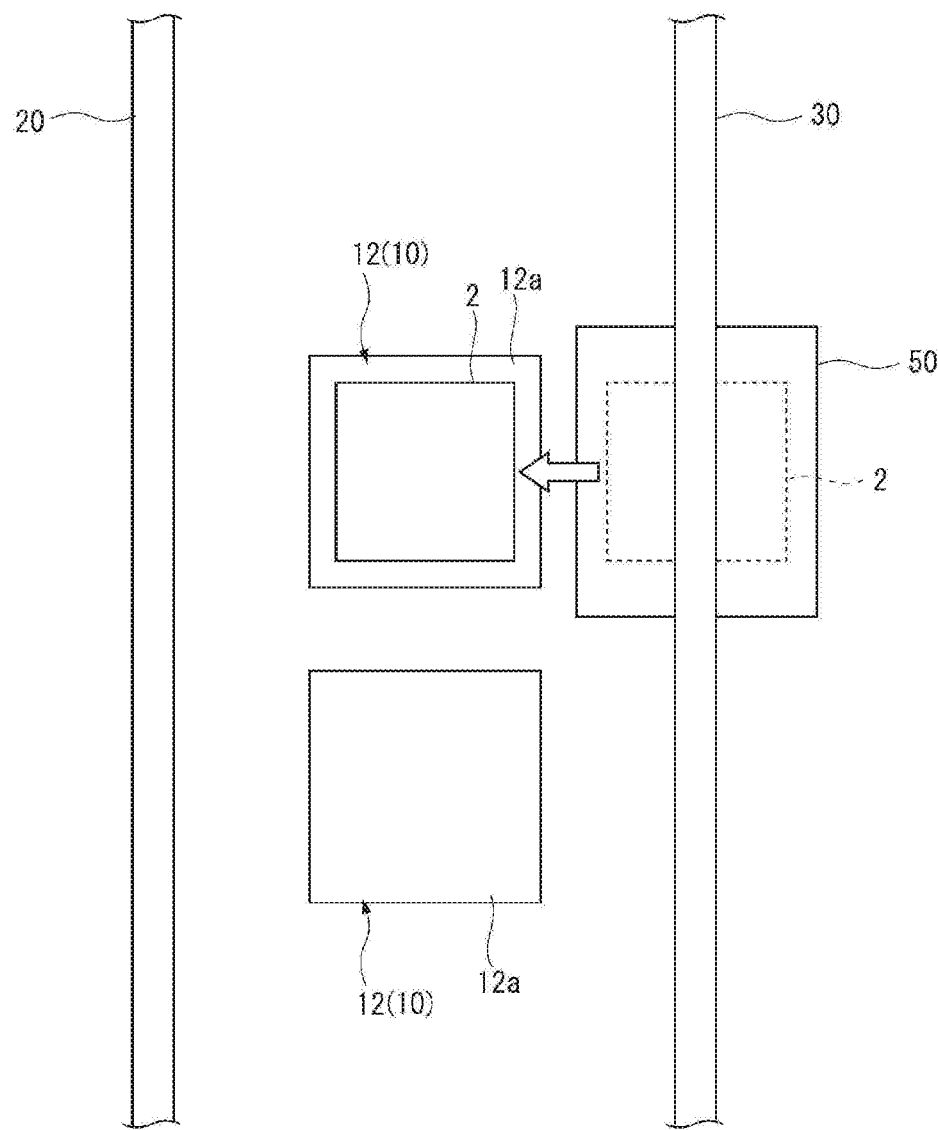
FIG. 10 is a view illustrating an operation for transferring an article from an overhead transport vehicle to a carry-in/out port.
Figure 11:
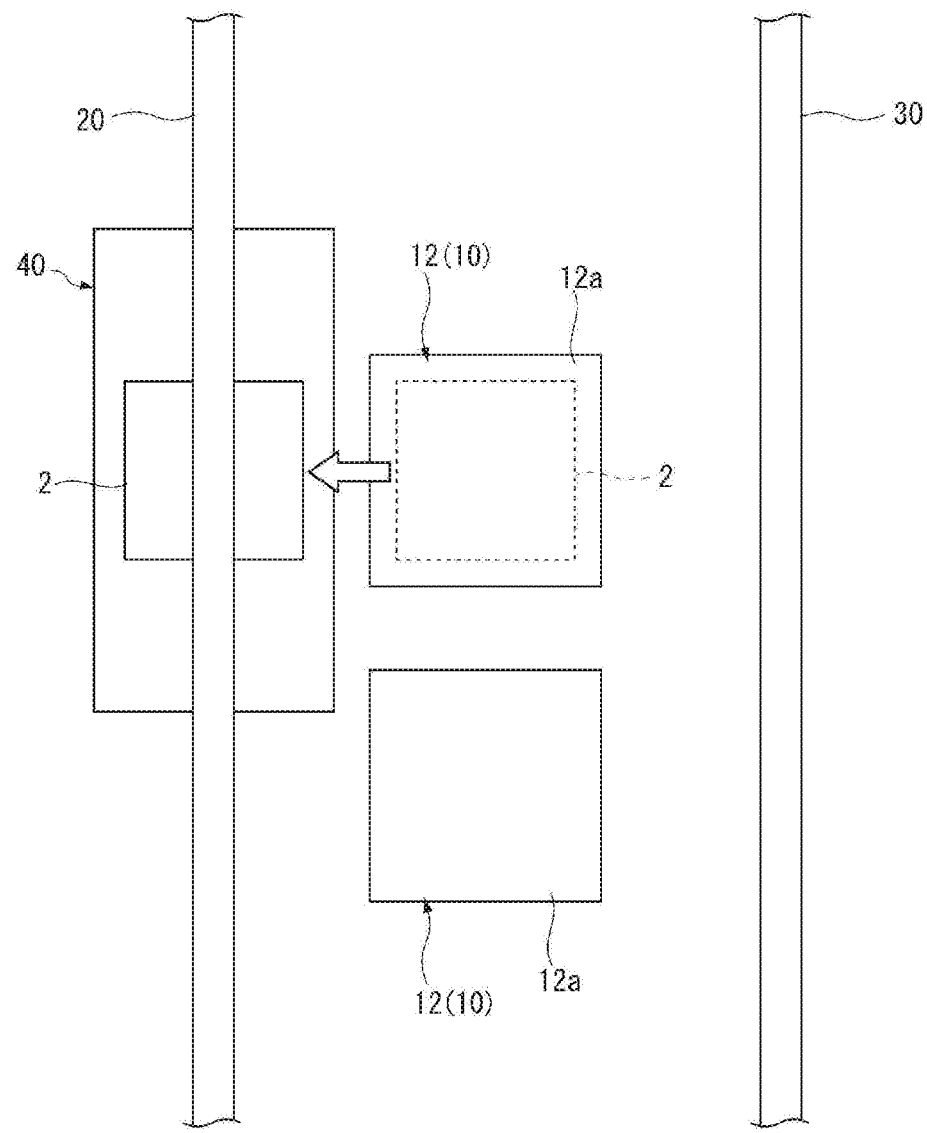
FIG. 11 is a view illustrating an operation for transferring an article from a carry-in/out port to a crane.

Also, in delivering an article 2 from the overhead transport vehicle 50 to the crane 40, the carry-in/out port 12 is used. FIGS. 10 and 11 are views illustrating an operation for delivering an article 2 from the overhead transport vehicle 50 to the crane 40. In FIGS. 10 and 11, the cutout CU (see FIG. 5) of the carry-in/out port 12 is omitted. As illustrated in FIG. 10, the overhead transport vehicle 50 moves along the circulating ceiling track 30 to the side of the carry-in/out port 12 and stops while holding the article 2 by the grip 53. Subsequently, the overhead transport vehicle 50 extends the lift driver 54 and the grip 53 laterally to the protrusion position by the lateral extender 55 while gripping the article 2 so that the article 2 is disposed above the carry-in/out port 12. Subsequently, the lift driver 54 is driven to lower the grip 53 such that the article 2 is placed on the carry-in/out port 12.

When the article 2 is placed on the carry-in/out port 12 by the overhead transport vehicle 50, as illustrated in FIG. 11, the crane 40 moves along the crane ceiling track 20 to the side of the carry-in/out port 12 and stops. Subsequently, the crane 40 extends the extensible portion 48 such that the placement table 49 is disposed below the article 2. Subsequently, the lift driver 45 is driven to raise the hoisting table 44, and the article 2 is delivered from the carry-in/out port 12 to the placement table 49. Subsequently, the extensible portion 48 is contracted such that the article 2 is disposed above the hoisting table 44.

Through the series of operation, the article 2 is delivered from the overhead transport vehicle 50 to the crane 40 through the carry-in/out port 12. After the article 2 is received, for example, the crane 40 moves to any of the storage shelves 11 while the article 2 is still placed on the placement table 49. In this manner, the article 2 can be transferred to the storage shelf 11 by the transfer device 42.

In this manner, in the stocker system SYS according to the first example, the shelves 10 and the crane 40 are disposed in a space on the ceiling equal to or higher than the height H2 of the processing device TL. Hence, a large-capacity stocker 100 capable of carrying in and out articles 2 can be implemented without being installed on the floor F. The vertical dimension of the storage shelf 11 is smaller than that of the carry-in/out port 12. Hence, even when the storage shelves 11 are provided in multiple stages, the dimension in the up-down direction can be suppressed. As a result, by storing articles 2 in the storage shelves 11, the articles 2 can be stored with high density to improve the storage efficiency of the articles 2. The space below the stocker 100 can be effectively used as the worker passage PS.

In the first example, the overhead transport vehicle 50 circulating in the circulating ceiling track 30 delivers and receives an article 2 to and from the load port LP. With this configuration, the article 2 can be delivered and received between the stocker 100 (shelves 10) and the load port LP while the overhead transport vehicle 50 circulates in the circulating ceiling track 30 in the bay (intra-bay). For example, as illustrated in FIG. 2, the overhead transport vehicle 50 can deliver (place) an article 2 received from the carry-in/out port 12A to the load port LPA by circulating in the circulating ceiling track 30. In this manner, a large-capacity stocker 100 can be installed at a place where the overhead transport vehicle 50 circulating in the circulating ceiling track 30 in the bay can deliver and receive articles 2.

In the first example, the crane ceiling track 20 is a single straight track. With this configuration, the stocker 100 can be installed in a place where the gap between the tracks (see FIG. 2) in the Y direction in parallel to the circulating ceiling track 30 is narrow. When the gap between the tracks in the Y direction in parallel is wide (for example, when gap between processing devices TL in X direction in bay is wide), the crane ceiling track 20 may be a circulating track as in a second example described later.

In the first example, as illustrated in FIG. 1, the crane ceiling track 20 is provided at a position higher than the system ceiling SC2 that supports the circulating ceiling track 30. With this configuration, a space above the system ceiling SC2, which is otherwise a dead space, can be utilized as a storage space for articles 2 or an arrangement space for the crane 40 as a transfer device for articles 2. The height of the circulating ceiling track 30 remains unchanged (or is suppressed to be low) owing to the system ceiling SC2. Hence, the rising and lowering stroke of the article 2 to the load port LP in the overhead transport vehicle 50 can be suppressed.

Second Example

Figure 12:
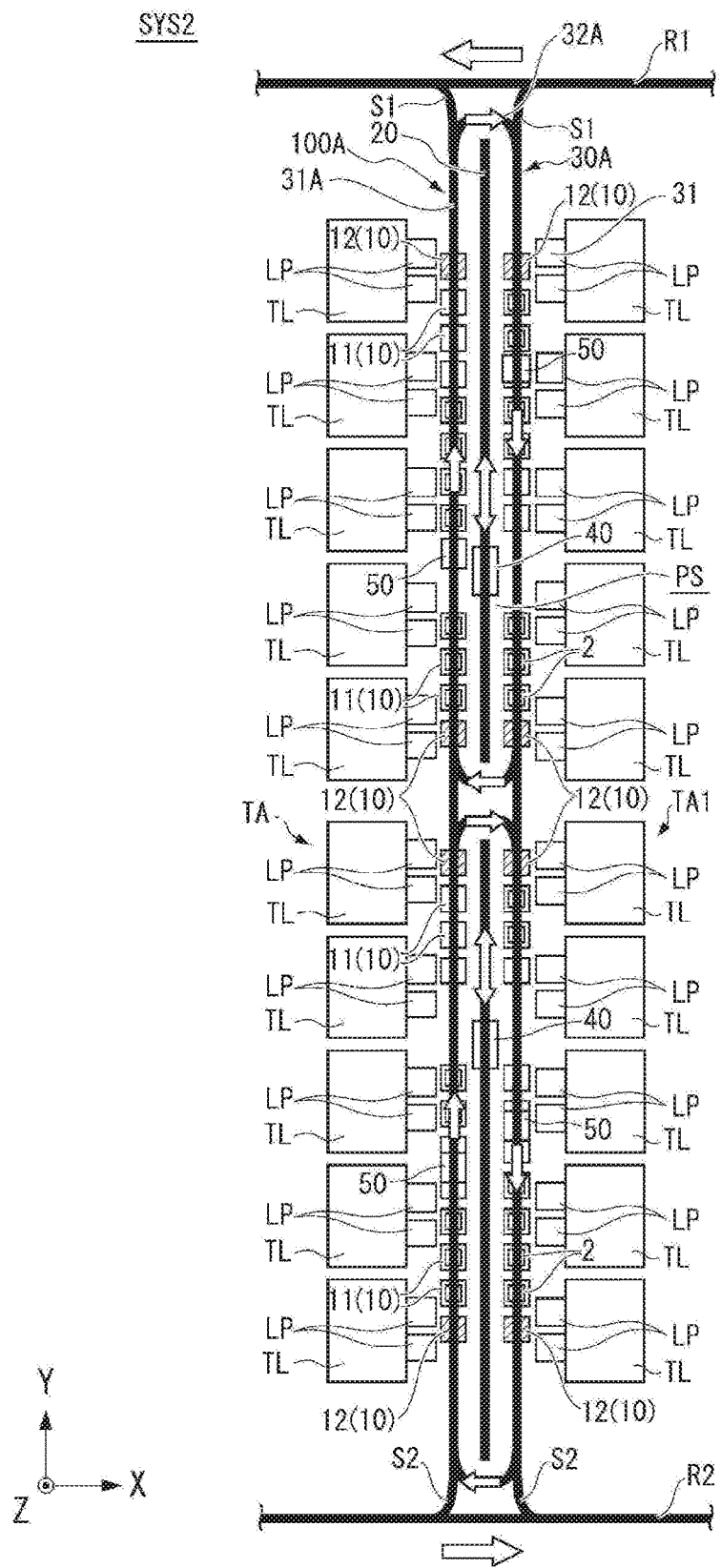
FIG. 12 is a plan view illustrating an example of a stocker system according to a second configuration.
Figure 13:
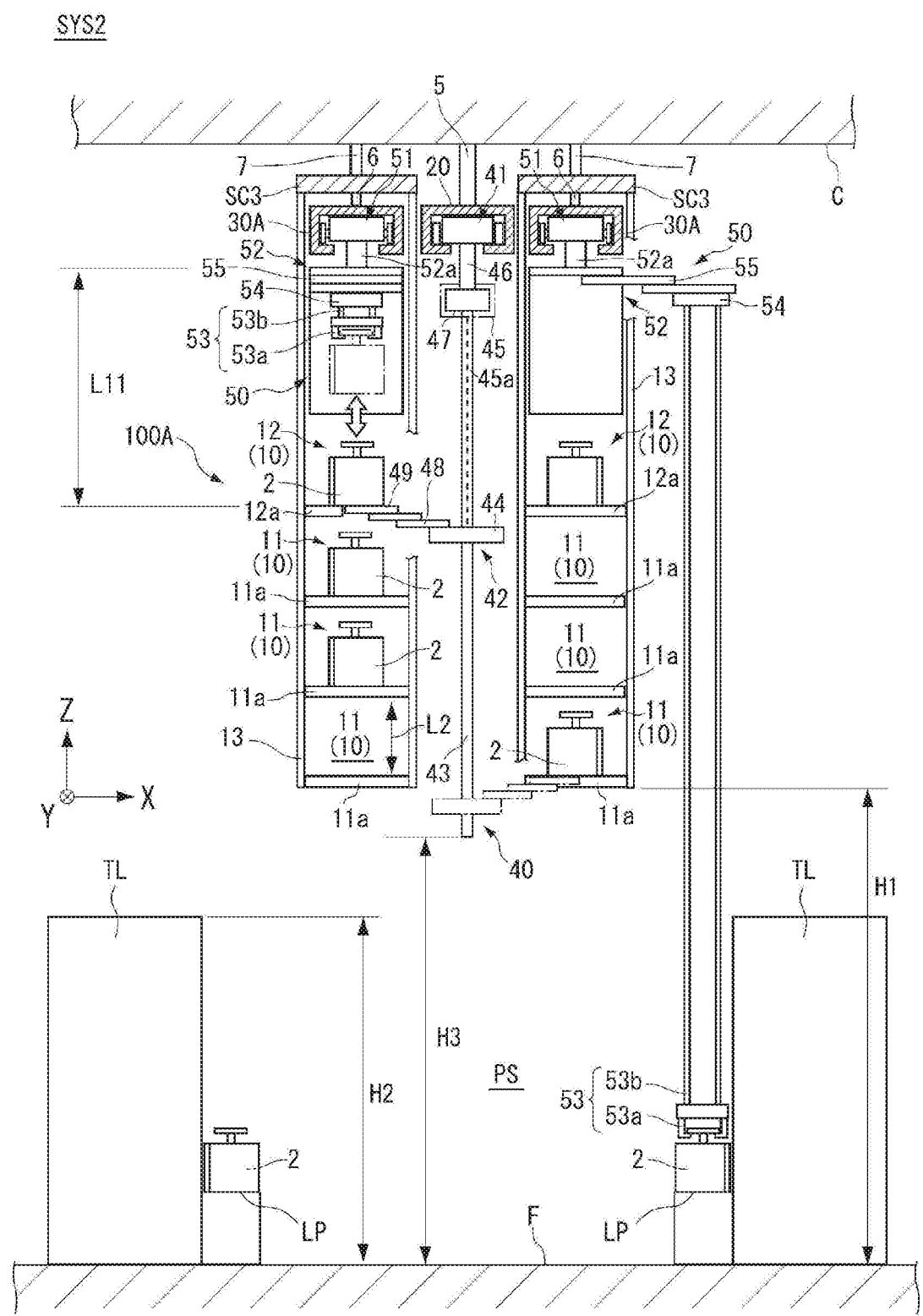
FIG. 13 is a view of the stocker system illustrated in FIG. 12 as seen from the Y direction.

In the above-mentioned first example, the configuration in which the circulating ceiling track 30 is located immediately above the load ports LP of the processing devices TL and the carry-in/out ports 12 (shelves 10) are disposed below and lateral to the circulating ceiling track 30 has been described, but the example is not limited to this configuration. FIG. 12 is a plan view illustrating an example of a stocker system SYS2 according to the second example. FIG. 13 is a view of the stocker system SYS2 illustrated in FIG. 12 as seen from the Y direction. In the following description, the same or equivalent configurations as in the above-mentioned first example are denoted by the same reference symbols, and descriptions thereof are omitted or simplified.

The stocker system SYS2 illustrated in FIG. 12 includes a stocker 100A. The stocker 100A has a plurality of shelves 10 and a crane 40. As illustrated in FIGS. 12 and 13, in the stocker system SYS2, carry-in/out ports 12 (shelves 10) are disposed immediately below a circulating ceiling track 30A, and load ports LP of processing devices TL are disposed below and lateral to the circulating ceiling track 30A. The circulating ceiling track 30A has straight parts 31A and connections 32A. An overhead transport vehicle 50 can circulate and run in one direction (for example, counter-clockwise direction in plan view) along the straight parts 31A and the connections 32A. The straight parts 31A are disposed in the Y direction along the shelves 10 immediately above the shelves 10. The two straight parts 31A are disposed in parallel to a crane ceiling track 20. The connections 32A include curves and are disposed on both ends on the +Y side and the −Y side to connect the two straight parts 31A. In the circulating ceiling track 30A, a gap between the two straight parts 31A in the X direction is narrower than that in the circulating ceiling track 30 illustrated in FIG. 2.

The crane 40 runs in the straight crane ceiling track 20 accommodated on the inner side of a circulating ceiling track 30B in plan view. The crane ceiling track 20 is provided while being suspended from a ceiling C by a hanging hook 5 as illustrated in FIG. 13, but may be suspended from the system ceiling SC1 (see FIG. 1) instead of this configuration, or may be suspended from a system ceiling SC3 described later when the system ceiling SC3 is wide. The height of the crane ceiling track 20 is set to be equal or substantially equal to that of the circulating ceiling track 30A, but may be set higher or lower than the circulating ceiling track 30A.

The shelves 10 are each provided while being suspended from the system ceiling SC3 by frames 13. The system ceiling SC3 is disposed while being suspended from the ceiling C of a building by a hanging hook 7. The shelves 10 may be suspended from the ceiling C instead of being suspended from the system ceiling SC3. As with the stocker 100 in the above-mentioned first example, the height of a lower end of the shelves 10 from the floor F is set to a height H1 higher than a height H2 of the processing device TL, and a height H3 of lower ends of masts 43 of the crane 40 is higher than the height H2 of the processing device TL. Thus, the shelves 10 are disposed above the processing devices TL also in the stocker 100A in the second example.

The circulating ceiling track 30A is provided below the system ceiling SC3 while being suspended from the system ceiling SC3 by a hanging hook 6. The circulating ceiling track 30A is disposed above the shelves 10 in a region sandwiched by the frames 13. The shelves 10 include storage shelves 11 in three vertical stages and a carry-in/out port 12 disposed in the topmost stage. FIG. 12 illustrates the carry-in/out ports 12 on both ends in the running direction (Y direction) of the crane 40, but the topmost stage of the shelves 10 is the carry-in/out port 12. The number of stages of the storage shelves 11 can be freely set and, for example, four or more stages may be provided below the carry-in/out port 12. The storage shelf 11 has the vertical dimension L2 (see FIG. 3), as with the first example.

The carry-in/out port 12 can deliver and receive an article 2 when the overhead transport vehicle 50 lowers the grip 53 without extending the grip 53 laterally by the lateral extender 55. The carry-in/out port 12 in the shelves 10 has a vertical dimension L11, which is larger than the vertical dimension L2 of the storage shelf 11. The carry-in/out port 12 in the second example needs a running space for the overhead transport vehicle 50 thereabove, and further needs a space to place an article 2 thereon or gripping an article 2 by raising and lowering the grip 53 from the overhead transport vehicle 50, and hence has the vertical dimension L11, which is larger than the vertical dimension L2 of the storage shelf 11. The vertical dimension L2 of the storage shelf 11 is smaller than the vertical dimension L11 of the carry-in/out port 12. Hence, as with the first example, even when the storage shelves 11 are provided in multiple stages, the dimension in the up-down direction can be suppressed. As a result, a plurality of articles 2 can be stored with high density owing to the storage shelves 11, and the storage efficiency of the articles 2 can be improved.

In the stocker 100A, the crane 40 can deliver and receive articles 2 to and from the storage shelves 11 and the carry-in/out ports 12. The overhead transport vehicle 50 delivers and receives an article 2 to and from the carry-in/out port 12 disposed in the topmost stage of the shelves 10 simply by raising and lowering the grip 53 by the lift driver 54 without extending the grip 53 laterally to the circulating ceiling track 30A. Thus, as with the above-mentioned stocker 100, an article 2 can be delivered from the crane 40 to the overhead transport vehicle 50 through the carry-in/out port 12, and an article 2 can be delivered from the overhead transport vehicle 50 to the crane 40.

As illustrated in FIG. 13, after receiving an article 2 from the carry-in/out port 12, the overhead transport vehicle 50 extends the grip 53 and the lift driver 54 laterally to the protrusion position by the lateral extender 55, and disposes the grip 53 immediately above the load port LP of the processing device TL. Subsequently, the overhead transport vehicle 50 lowers the grip 53 by the lift driver 54 so that the article 2 can be placed on the load port LP of the processing device TL. Also in receiving an article 2 placed on the load port LP of the processing device TL, the grip 53 and the lift driver 54 are extended laterally to the protrusion position by the lateral extender 55, and the grip 53 is lowered by the lift driver 54 so that the article 2 can be gripped from the above.

In this manner, in the stocker system SYS2 according to the second example, the carry-in/out port 12 in the shelves 10 is provided immediately below the circulating ceiling track 30A. Hence, the overhead transport vehicle 50 can deliver and receive an article 2 to and from the carry-in/out port 12 simply by raising and lowering the grip 53 (article 2) without extending the grip 53 laterally to the circulating ceiling track 30A. In the stocker system SYS2, even when the gap between the two straight parts 31A of the circulating ceiling track 30A in the X direction is narrow, the stocker 100A capable of storing articles 2 with high density can be installed.

Third Example

Figure 14:
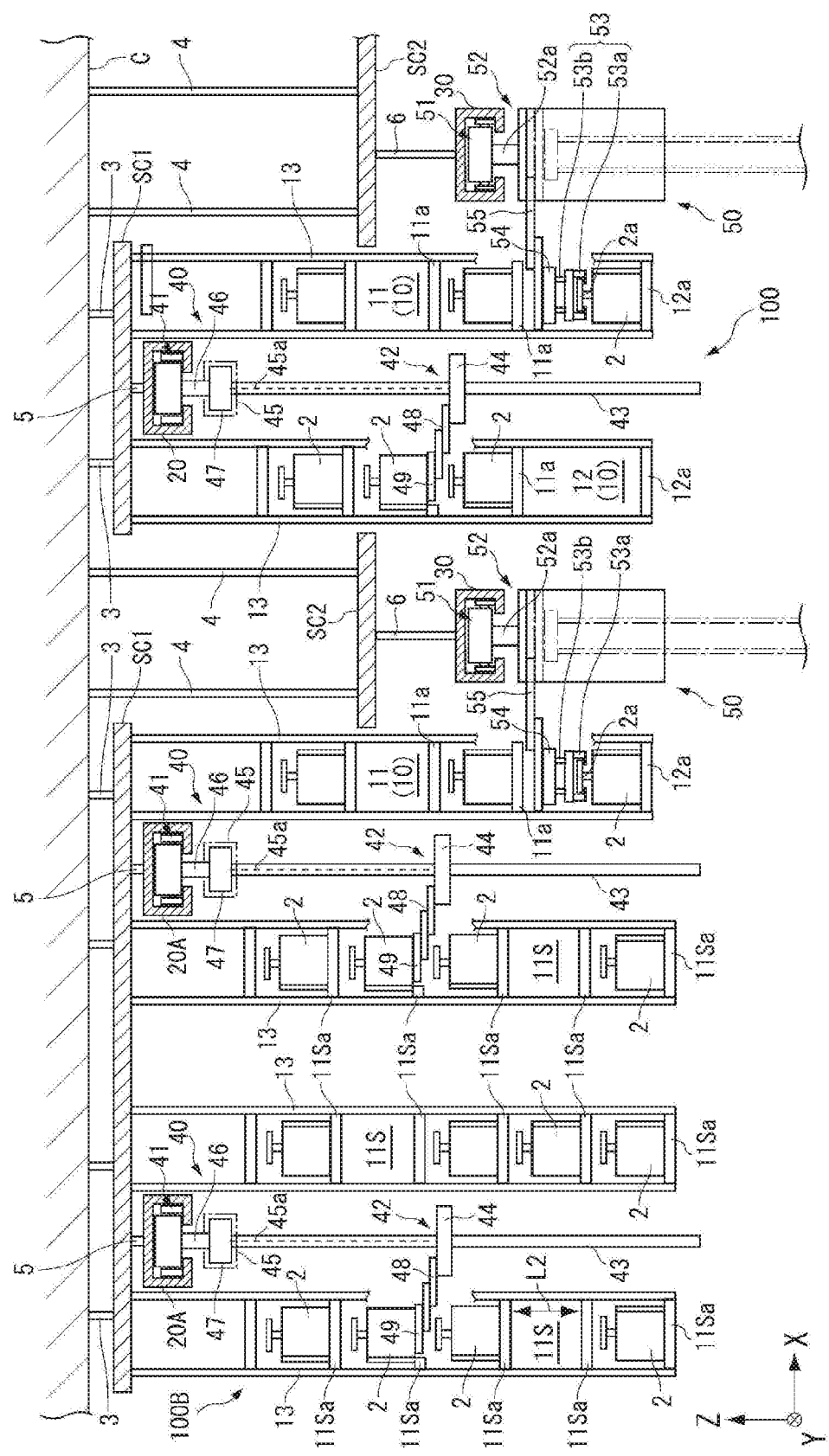
FIG. 14 is a view illustrating an example of a stocker system according to a third configuration as seen from the Y direction.

In the above-mentioned first and second examples, the configurations in which the stockers 100 and 100A are disposed on the inner side of the circulating ceiling tracks 30 and 30A in plan view have been exemplified, but the examples are not limited to these configurations. FIG. 14 is a view illustrating a stocker system SYS3 according to a third example as seen from the Y direction. In the following description, the same or equivalent configurations as in the above-mentioned first example are denoted by the same reference symbols, and descriptions thereof are omitted or simplified.

As illustrated in FIG. 14, the stocker system SYS3 includes a stocker 100 on the inner side of a circulating ceiling track 30 and further includes a stocker 100B on the outer side of the circulating ceiling track 30. The stocker 100B has a plurality of shelves 10 and a crane 40 and has a carry-in/out port 12 to deliver and receive an article 2 to and from an overhead transport vehicle 50 running in the circulating ceiling track 30. The overhead transport vehicle 50 can deliver and receive an article 2 to and from the carry-in/out port 12 in the stocker 100B by extending a grip 53 laterally by a lateral extender 55.

Storage shelves 11 in multiple stages are provided above the carry-in/out port 12 in the stocker 100B. On the opposite side of the carry-in/out port 12 across a running region of the crane 40, second storage shelves 11S capable of placing an article 2 or taking out an article 2 by the crane 40 are provided. The second storage shelf 11S includes a shelf plate 11Sa and is held by a system ceiling SC1 by a frame 13. The second storage shelves 11S are each provided with a vertical dimension having a length L2, as with the above-mentioned storage shelf 11, and are provided in multiple stages (five stages in this example) in the up-down direction. The vertical dimension of the second storage shelf 11S is the length L2. Hence, a plurality of articles 2 can be stored even on the outer side of the circulating ceiling track 30, and the storage efficiency of the articles 2 can be improved. Placing an article 2 on the second storage shelf 11S means placing an article 2 on the shelf plate 11Sa of the second storage shelf 11S.

The second storage shelves 11S do not deliver or receive articles 2 to or from the overhead transport vehicle 50 running in the circulating ceiling track 30, and hence have no carry-in/out port 12. Thus, the second storage shelf 11S can be disposed instead of the carry-in/out port 12, and hence a larger number of articles 2 can be stored. The height of the lower end of the second storage shelves 11S is set to be higher than the height H2 of the processing device TL, as with the shelves 10 in the above-mentioned examples.

The crane 40 circulates and runs in a crane circulating ceiling track 20A on the outer side of the circulating ceiling track 30. In FIG. 14, for example, the crane 40 runs in the right crane circulating ceiling track 20A in the −Y direction and runs in the left crane circulating ceiling track 20A in the +Y direction to circulate and run in the crane circulating ceiling track 20A. The crane circulating ceiling track 20A has straight sections and circulating sections (see stocker system SYS4 in FIG. 15 described later). The second storage shelves 11S are provided on both sides of the running region of the crane 40 correspondingly to the straight sections of the crane circulating ceiling track 20A.

By circulating and running in the crane circulating ceiling track 20A, the crane 40 can receive an article 2 from the second storage shelf 11S or the storage shelf 11 and place the article 2 in the carry-in/out port 12. The crane 40 can receive an article 2 placed on the carry-in/out port 12 through the overhead transport vehicle 50 and place the article 2 on the second storage shelf 11S or the storage shelf 11. The crane 40 running in the crane circulating ceiling track 20A may have the same configuration as that of the crane 40 running in the crane ceiling track 20 or may have a different configuration.

In this manner, the stocker system SYS3 includes the stocker 100B having the second storage shelves 11S on the outer side of the circulating ceiling track 30. Hence, a large-capacity stocker system capable of storing many articles 2 can be implemented near the ceiling of a building, and a space near the ceiling can be effectively utilized.

Fourth Example

Figure 15:
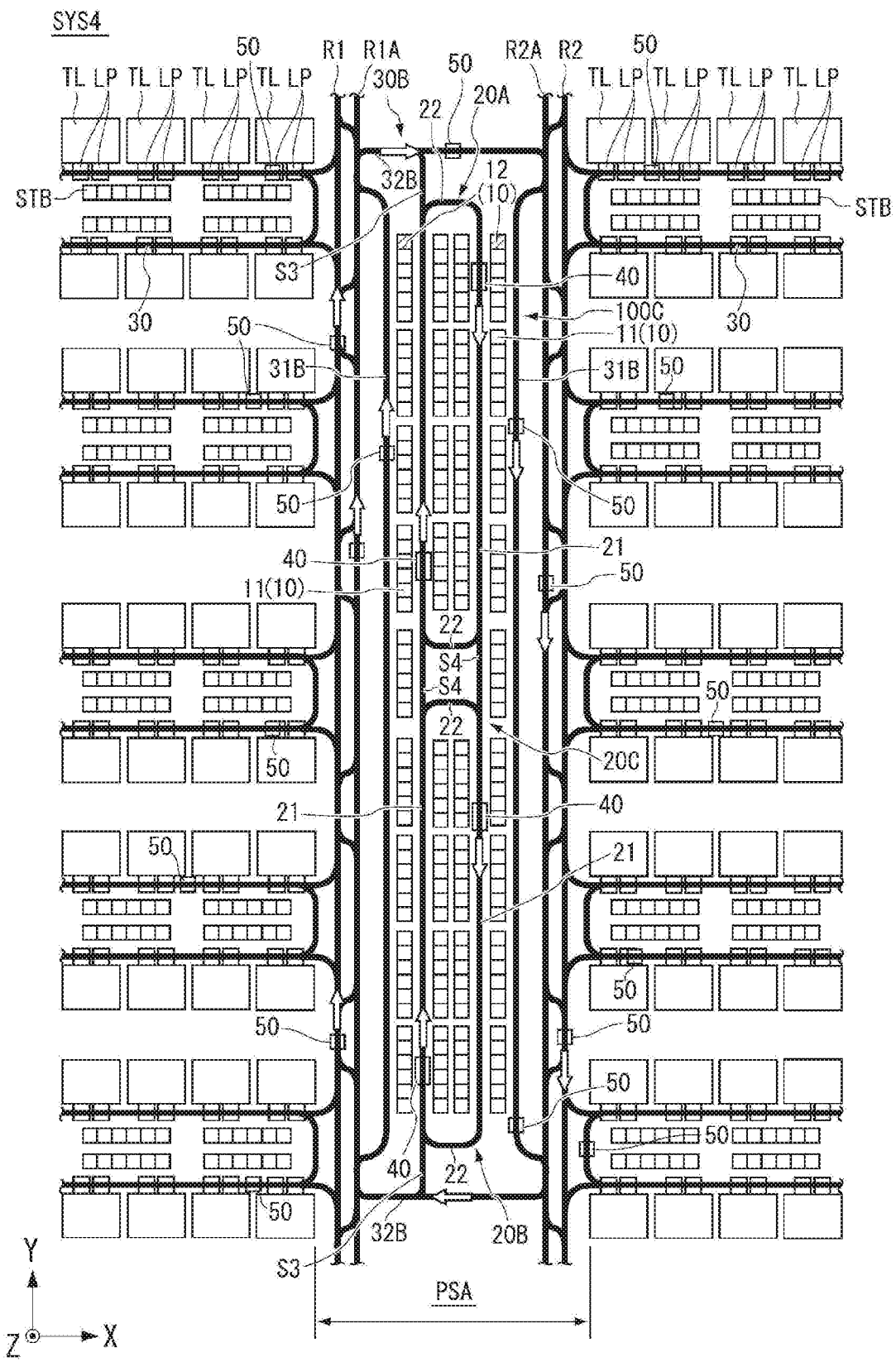
FIG. 15 is a plan view illustrating an example of a stocker system according to a fourth configuration.

FIG. 15 is a plan view illustrating a stocker system SYS4 according to a fourth example. In the following description, the same or equivalent configurations as in the above-mentioned examples are denoted by the same reference symbols, and descriptions thereof are omitted or simplified. The stocker system SYS4 illustrated in FIG. 15 includes a stocker 100C. The stocker 100C has a plurality of shelves 10 and a crane 40. The stocker system SYS4 illustrated in FIG. 15 has a configuration in which the crane circulating ceiling tracks 20A and 20B as two circulating tracks are connected by two connection tracks S4, and the crane 40 runs in the crane circulating ceiling tracks 20A and 20B and the connection tracks S4.

As illustrated in FIG. 15, the crane circulating ceiling tracks 20A and 20B are disposed on the inner side of the circulating ceiling track 30A in plan view, and each have straight sections 21 and connection sections 22. The two straight sections 21 are each provided to extend in parallel to the Y direction and are disposed in the X direction side by side. The connection sections 22 couple ends of the two straight sections 21 on the +Y side and the −Y side. The two connection tracks S4 are provided to connect the straight sections 21 of the crane circulating ceiling track 20A and the straight sections 21 of the crane circulating ceiling track 20B.

The crane 40 circulates and runs in the crane circulating ceiling tracks 20A and 20B in one direction (for example, counterclockwise direction in plan view) along the straight sections 21 and the connection sections 22. The crane 40 can move from the crane circulating ceiling track 20A to the crane circulating ceiling track 20B through the connection track S4 or move from the crane circulating ceiling track 20B to the crane circulating ceiling track 20A through the connection track S4. The cranes 40 are operated in any of a first state in which the cranes 40 transport articles 2 while circulating and running in the crane circulating ceiling tracks 20A and 20B and a second state in which the cranes 40 transport articles 2 while circulating and running in a circulating track 20C formed by a part of the crane circulating ceiling tracks 20A and 20B and two connection tracks S4, and is provided with a controller to control the cranes 40 to operate in any of the first state and the second state.

The controller can change the proportion (time proportion) by which the cranes 40 operate in the first state and the second state. The controller selectively establishes the first state and the second state depending on the operation state of the processing devices TL in each bay such that the transportation efficiency is improved (or changes proportion by which cranes 40 operate in first state and second state). The crane circulating ceiling tracks 20A and 20B have the same or substantially the same shape and size in plan view and are disposed in the Y direction side by side. The crane circulating ceiling tracks 20A and 20B may have different shapes and sizes in plan view. As with the crane ceiling track 20 illustrated in FIG. 1, the crane circulating ceiling tracks 20A and 20B and the connection tracks S4 are provided while being suspended from the system ceiling SC1 or the ceiling C.

The circulating ceiling tracks 30B in which the overhead transport vehicle 50 runs are disposed between inter-bay routes R1 and R1A and inter-bay routes R2 and R2A. The inter-bay routes R1 and R1A are provided to extend in the Y direction in parallel. Similarly, the inter-bay routes R2 and R2A are provided to extend in the Y direction in parallel. The inter-bay routes R1, R1A, R2, and R2A are inter-bay tracks that connect intra-bays. The region below the place where the inter-bay routes R1, R1A, R2, and R2A, the circulating ceiling tracks 30B, and the stocker 100C are provided is a main passage PSA.

The main passage PSA is formed between the processing device TL in the intra-bay and the processing device TL in the opposed intra-bay. The main passage PSA is a worker passage, and is used as, for example, a passage to carry in or out the processing device TL. The circulating ceiling track 30B is formed by using two straight parts 31B, a connection 32B, and a part of the inter-bay routes R1A and R2A. The two straight parts 31B are each provided to extend in parallel to the Y direction and are disposed in the X direction side by side. Ends on the +Y side and the −Y side of the straight part 31B on the +X side are connected to the inter-bay route R2A. Ends on the +Y side and the −Y side of the straight part 31B on the −X side are connected to the inter-bay route R1A. The straight part 31A is an expanded rail that is closer to the stocker 100C (shelves 10) than the inter-bay routes R1A and R2A disposed above the main passage PSA such that the stocker 100C can be more easily accessed. With this configuration, even when the width of the main passage PSA in the X direction is wide, the width of the stocker 100C in the X direction can be suppressed.

When the width of the stocker 100C in the X direction is large or when the width of the main passage PSA in the X direction is small, the circulating ceiling track 30B may be formed by using the inter-bay routes R1A and R2A instead of the straight part 31B. The connection 32B is provided to connect the inter-bay route R1A and the inter-bay route R2A on the +Y side and the −Y side of the two straight parts 31B. As with the circulating ceiling track 30 illustrated in FIG. 1, the circulating ceiling track 30B is provided while being suspended from the system ceiling SC2 or the ceiling C.

The overhead transport vehicle 50 can circulate and run in one direction (for example, clockwise direction in plan view) along the circulating ceiling track 30B. The crane 40 also circulates and runs in one direction (for example, clockwise direction in plan view) along the crane circulating ceiling tracks 20A and 20B. In this manner, by circulating the crane 40 and the overhead transport vehicle 50 in the same direction, both of the crane 40 and the overhead transport vehicle 50 can be controlled by a controller having a control program in the same format. Hence, the control can be simplified compared to control for circulating one of the crane 40 and the overhead transport vehicle 50 in an opposite direction. The overhead transport vehicle 50 runs through the inter-bay route R1A or the inter-bay route R2A when entering the connection 32B from the straight part 31B or when entering the straight part 31B through the connection 32B. The circulating ceiling track 30B is not limited to the configuration in which a part of the inter-bay route R1A or the inter-bay route R2A is used, and ends of the straight part 31B on the +Y side and the −Y side may be coupled by the connections 32B.

In plan view, the plurality of shelves 10 are provided between the circulating ceiling track 30B and the crane circulating ceiling tracks 20A and 20B and on the inner side of the crane circulating ceiling tracks 20A and 20B. In other words, all the shelves 10 are disposed on the inner side of the circulating ceiling track 30B in plan view. The shelves 10 have storage shelves 11 and carry-in/out ports 12. The carry-in/out ports 12 are provided to the shelves 10 disposed between the circulating ceiling track 30B and the crane circulating ceiling tracks 20A and 20B. The shelves 10 provided on the inner side of the crane circulating ceiling track 20A cannot be accessed by the overhead transport vehicle 50, and have no carry-in/out port 12 but have only the storage shelves 11. In FIG. 15, the carry-in/out ports 12 are illustrated at ends of the shelves 10 on the +Y side, and as with the above-mentioned first example, the lowermost stage of the shelves 10 is the carry-in/out port 12.

The stocker 100C is installed above the main passage PSA, and the height H1 (see FIG. 1) of the lower ends of the shelves 10 and the height H3 (see FIG. 1) of the lower end of the crane 40 (masts 43) are higher than the height H2 (see FIG. 1) of the processing device TL. This configuration enables the main passage PSA to be used for carrying in or out the processing device TL.

Branch lines S3 are provided between the +Y side of the crane circulating ceiling track 20A and the connection 32B of the circulating ceiling track 30B and between the −Y side of the crane circulating ceiling track 20B and the connection 32B of the circulating ceiling track 30B. The crane 40 can enter the circulating ceiling track 30B through the branch line S3 and can enter the inter-bay route R1A or the inter-bay route R2A from the circulating ceiling track 30B. Whether to provide the branch line S3 can be freely determined, and the branch line S3 is not necessarily required to be provided.

The circulating ceiling tracks 30 connected to the inter-bay route R1 or the inter-bay route R2 are provided with storage shelves STB. For example, the storage shelves STB are provided while being suspended from the ceiling C and can place articles 2 thereon. The overhead transport vehicle 50 can deliver and receive an article 2 to and from the storage shelf STB. The stocker 100 as illustrated in FIG. 1 may be disposed in the circulating ceiling track 30 instead of the storage shelf STB.

Also in the stocker 100C illustrated in FIG. 15, as with the above-mentioned stocker 100, an article 2 can be delivered from the crane 40 to the overhead transport vehicle 50 through the carry-in/out port 12, and an article 2 can be delivered from the overhead transport vehicle 50 to the crane 40. In FIG. 15, two cranes 40 are disposed in the crane circulating ceiling tracks 20A and 20B each, but the number of the cranes 40 disposed can be freely determined.

In this manner, in the stocker system SYS4 according to the fourth example, the shelves 10 are provided between the circulating ceiling track 30B and the crane circulating ceiling tracks 20A and 20B and on the inner side of the crane circulating ceiling tracks 20A and 20B. Hence, many articles 2 can be stored to implement a large-capacity stocker system.

In the fourth example, two rows of the shelves 10 are disposed on the inner side of the crane circulating ceiling tracks 20A and 20B. Hence, when the crane 40 transfers articles 2, the directions of the articles 2 can be made uniform (same) to make it easy to control the transfer of the articles 2 by the crane 40. For example, when one row of the shelves 10 are disposed on the inner side of the crane circulating ceiling tracks 20A and 20B, the directions of articles 2 are reverse between when the articles 2 are delivered and received to and from the shelves 10 from the +X side and when the articles 2 are delivered and received to and from the −X side. Hence, the crane 40 needs to be controlled to rotate the articles 2 such that the articles 2 to be stored in the shelves 10 are oriented in the same direction when the articles 2 are delivered and received from the crane circulating ceiling tracks 20A and 20B to the shelves 10.

While examples have been described, this disclosure is not limited to the above description and can be variously changed in the range not departing from the spirit of the appended claims. For example, in the stocker systems SYS and SYS2 illustrated in FIGS. 1 and 13, the configuration in which the crane ceiling track 20 is not connected to the circulating ceiling tracks 30 and 30A has been exemplified, but the examples are not limited to this configuration. For example, for maintenance of the crane 40, the crane ceiling track 20 and the circulating ceiling tracks 30 and 30A may be connected through branch lines such that the crane 40 temporarily runs in the circulating ceiling tracks 30 and 30A (such that crane 40 enters track for overhead transport vehicle 50 through circulating ceiling tracks 30 and 30A).

In the above-mentioned stocker systems SYS, SYS2, SYS3, and SYS4, the configuration in which the shelves 10, the crane ceiling track 20, the crane circulating ceiling tracks 20A and 20B, and the circulating ceiling tracks 30, 30A, and 30B are suspended from the ceiling C or the system ceilings SC1, SC2, and SC3 has been exemplified, but the examples are not limited to this configuration. For example, at least one of the shelves 10, the crane ceiling track 20, the crane circulating ceiling tracks 20A and 20B, and the circulating ceiling tracks 30, 30A, and 30B may be supported by a support pillar, a frame, or a mount extending upward from the floor F such that load of the shelves 10 is received by the floor F.

The contents of JP 2018-054470 and all documents cited herein are incorporated herein by reference.

The invention claimed is:

1. A stocker system comprising a stocker adapted to store articles transported by an overhead transport vehicle having a grip that grips an upper part of an article from an upper side and a lift driver that raises and lowers the grip, runs in a track placed on a ceiling of a building, and puts down and places an article onto a load port of a device installed below the track,
    wherein the stocker is disposed above the device and includes:
        a plurality of shelves provided in multiple stages in an up-down direction, to place articles thereon; and
        a crane that places an article on the shelves or takes out an article placed on the shelves,
    a height of a lower end of the shelves is higher than a height of the device,
    a height of a lower end of the crane is higher than the height of the device,
    the shelves include:
        a carry-in/out port used for each of the overhead transport vehicle and the crane to place an article thereon; and
        storage shelves used for the crane to place an article thereon,
    the carry-in/out port is provided to have a vertical dimension that allows the grip to put down an article from above and place the article thereon,
    more storage shelves are provided than the carry-in/out port, the storage shelves being provided to have a vertical dimension smaller than the vertical dimension of the carry-in/out port,
    the crane includes a transfer device to place an article thereon and put down and place the article onto the carry-in/out port or the storage shelves, and
    the crane directly places an article placed on the carry-in/out port by the overhead transport vehicle onto the storage shelves or directly takes out an article placed on the storage shelves and places the article on the carry-in/out port.

2. The stocker system according to claim 1, wherein
the track is located immediately above the load port,
the carry-in/out port is disposed below and lateral to the track, and
the overhead transport vehicle includes a lateral extender to extend the lift driver laterally to the track, and extends the lift driver laterally by the lateral extender to lower the grip, to put down and place an article on the carry-in/out port or receive an article placed on the carry-in/out port.

3. The stocker system according to claim 2, wherein the storage shelves are provided in multiple stages on at least one of an upper side and a lower side of the carry-in/out port.

4. The stocker system according to claim 1, wherein
the carry-in/out port is disposed immediately below the track, and
the overhead transport vehicle includes a lateral extender, and extends the lift driver laterally by the lateral extender to lower the grip, and puts down and places an article on the load port or receive an article placed on the load port.

5. The stocker system according to claim 4, wherein the storage shelves are provided in multiple stages on a lower side of the carry-in/out port.

6. The stocker system according to claim 1, wherein
the crane runs in a circulating track, and
the shelves are provided correspondingly to straight sections of the circulating track.

7. The stocker system according to claim 1, wherein a second storage shelf adapted to place an article thereon or take out an article therefrom by the crane is provided on an opposite side of the carry-in/out port across a running region of the crane.

* * * * *